United States Patent
Kasuya

(10) Patent No.: US 10,366,948 B2
(45) Date of Patent: Jul. 30, 2019

(54) SEMICONDUCTOR DEVICE AND METHOD FOR MANUFACTURING THE SAME

(71) Applicant: ROHM CO., LTD., Kyoto (JP)

(72) Inventor: Yasumasa Kasuya, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 211 days.

(21) Appl. No.: 15/393,318

(22) Filed: Dec. 29, 2016

(65) Prior Publication Data

US 2017/0271249 A1    Sep. 21, 2017

(30) Foreign Application Priority Data

Mar. 17, 2016    (JP) ................. 2016-054246

(51) Int. Cl.
*H01L 21/48*     (2006.01)
*H01L 23/31*     (2006.01)
*H01L 23/00*     (2006.01)
*H01L 23/498*    (2006.01)
*H01L 23/495*    (2006.01)
*H01L 21/56*     (2006.01)

(52) U.S. Cl.
CPC .... *H01L 23/49811* (2013.01); *H01L 21/4842* (2013.01); *H01L 21/4853* (2013.01); *H01L 21/561* (2013.01); *H01L 23/3121* (2013.01); *H01L 23/49541* (2013.01); *H01L 23/49582* (2013.01); *H01L 23/49866* (2013.01); *H01L 24/48* (2013.01); *H01L 2224/48091* (2013.01)

(58) Field of Classification Search
CPC ............... H01L 21/4853; H01L 21/561; H01L 23/3121; H01L 23/49541; H01L 23/49582; H01L 23/49811; H01L 23/49866; H01L 24/48; H01L 2224/48091; H01L 23/49586; H01L 23/49548; H01L 21/4803; H01L 21/4846
See application file for complete search history.

(56) References Cited

U.S. PATENT DOCUMENTS

| | | | | |
|---|---|---|---|---|
| 2011/0210354 A1* | 9/2011 | Ichikawa | ............ | B29C 45/0055 257/98 |
| 2011/0244629 A1* | 10/2011 | Gong | ................... | H01L 21/4828 438/112 |
| 2012/0292755 A1* | 11/2012 | Wang | ..................... | H01L 21/561 257/676 |
| 2013/0071970 A1* | 3/2013 | Fujimoto | ................ | H01L 24/97 438/113 |
| 2016/0056097 A1* | 2/2016 | Bai | .................... | H01L 23/49582 257/670 |
| 2016/0254214 A1* | 9/2016 | Makino | ................... | H01L 24/97 257/676 |
| 2016/0372403 A1* | 12/2016 | Lam | ....................... | H01L 21/561 |

FOREIGN PATENT DOCUMENTS

JP    2013-239740 A    11/2013

* cited by examiner

*Primary Examiner* — Caridad Everhart

(57) ABSTRACT

A semiconductor device 1 includes a semiconductor chip 2, a plurality of leads 4, disposed in a periphery of the semiconductor chip 2, and a sealing resin 5, sealing the semiconductor chip 2 and the leads 4 such that lower surfaces 18 and outer end surfaces 20 at sides opposite the semiconductor chip 2 of the leads 4 are exposed. Lead plating layers 21 arranged to improve solder wettability are formed on the lower surfaces 18 and the outer end surfaces 20 of the leads 4.

14 Claims, 22 Drawing Sheets

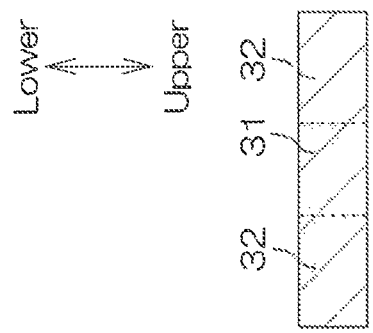
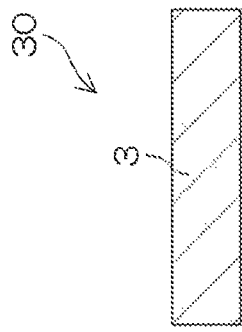
FIG. 5

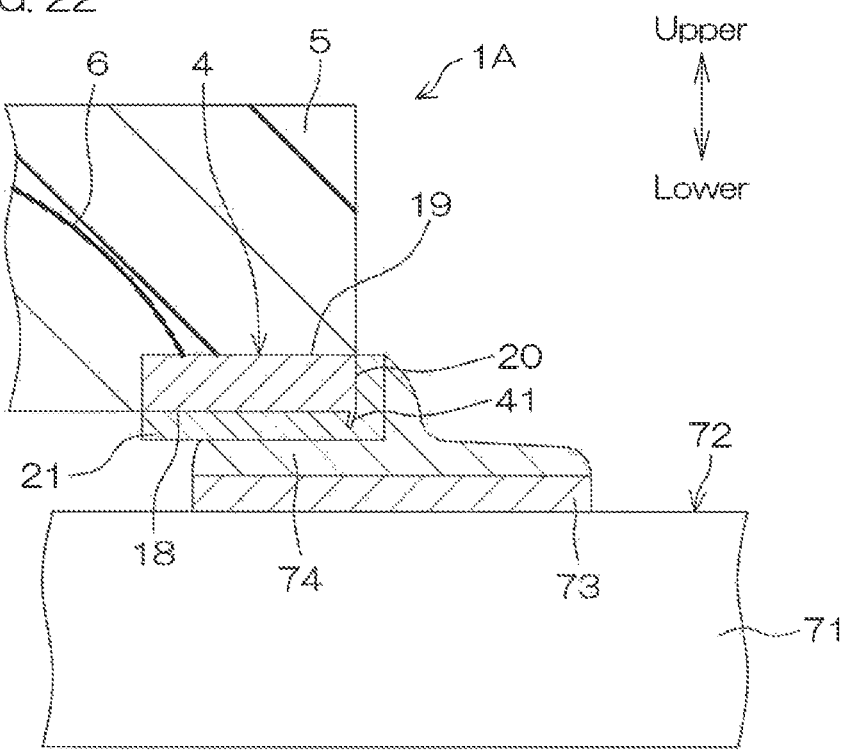

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the same.

2. Description of the Related Art

With the downsizing of electronic equipment, demand for semiconductor devices applying a QFN (Quad Flat Non-leaded Package) is growing.

A semiconductor device applying a QFN is prepared, for example, by a MAP (molded array packaging) method. With the MAP method, after a plurality of semiconductor chips on a lead frame are sealed in a batch with a sealing resin, cutting apart into individual semiconductor devices, each including a single semiconductor chip, is performed.

The lead frame is constituted, for example, of a metal that contains copper. The lead frame has a lattice-shaped supporting portion. A rectangular die pad and a plurality of leads are formed inside each rectangular region surrounded by the supporting portion. The leads are disposed in a periphery of the die pad. Each lead extends in a direction of facing the die pad. More specifically, each lead has a base end portion connected to the supporting portion and a free end portion formed to an elongate shape extending toward the die pad.

After a semiconductor chip has been die bonded onto each die pad, terminals formed at each semiconductor chip and upper surfaces of leads in the periphery are connected (wire bonded) via bonding wires. When the wire bonding of all of the semiconductor chips is completed, the lead frame is set in a molding die and all of the semiconductor chips on the lead frame are sealed in a batch by a resin. Plating layers arranged to improve solder wettability are then formed on a lower surface of the lead frame and a lower surface of the die pad that are exposed from the sealing resin.

Thereafter, along dicing lines set on the supporting portion, a dicing saw is inserted from a lower surface side of the lead frame and the supporting portion and the sealing resin on the supporting portion are removed. The respective leads are thereby cut off from the supporting portion and the individual semiconductor devices are obtained. With such a semiconductor device, a lower surface of each lead is exposed at a lower surface of the sealing resin and one end surface (cut surface made by the dicing saw) of the lead is exposed from a side surface of the sealing resin.

SUMMARY OF THE INVENTION

The inventor of preferred embodiments of the present invention described and claimed in the present application conducted an extensive study and research regarding a semiconductor device and a method for manufacturing the same, such as the one described above, and in doing so, discovered and first recognized new unique challenges and previously unrecognized possibilities for improvements as described in greater detail below.

Mounting of the above-described conventional semiconductor device on a mounting substrate (wiring substrate) is performed as follows. First, cream solder is coated on lands of the mounting substrate. The lower surfaces of the leads of the semiconductor device are then bonded to the cream solder. Surface mounting of the semiconductor device onto the mounting substrate is thereby accomplished.

However, with the above-described conventional semiconductor device, whereas the plating layers arranged to improve solder wettability are formed on the lower surfaces of the leads exposed from the sealing resin, plating layers are not formed on the end surfaces of the leads exposed from the sealing resin. The end surfaces of the leads are thus not readily wetted by the cream solder. Therefore with the above-described conventional semiconductor device, there is a problem that mounting strength onto the mounting substrate is low and reliability of connection therewith is low.

An object of the present invention is to provide a semiconductor device and a method for manufacturing the same by which reliability of connection with a mounting substrate can be improved.

In order to overcome the previously unrecognized and unsolved challenges described above, a preferred embodiment of the present invention provides a semiconductor device. The semiconductor device includes a semiconductor chip, a plurality of leads, disposed in a periphery of the semiconductor chip, and a sealing resin, sealing the semiconductor chip and the leads such that lower surfaces and outer end surfaces at sides opposite the semiconductor chip of the leads are exposed, and lead plating layers arranged to improve solder wettability are formed on the lower surfaces and the outer end surfaces of the leads.

With the present arrangement, the lead plating layers arranged to improve solder wettability are formed on the lower surfaces of the leads and the outer end surfaces of the leads and therefore not only the lower surfaces of the leads but the outer end surfaces of the leads are readily wetted by solder. Reliability of connection with a mounting substrate can thereby be improved.

In the preferred embodiment of the present invention, the sealing resin has a lower surface, at which the lower surfaces of the leads are exposed, an upper surface, at a side opposite the lower surface, and a side surface, which is continuous to the upper surface and the lower surface and at which the outer end surfaces of the leads are exposed. The side surface of the sealing resin includes a first side surface portion, disposed near the lower surface of the sealing resin, and a second side surface portion, disposed near the upper surface of the sealing resin. A step is formed between the first side surface portion and the second side surface portion such that the second side surface portion protrudes further outward than the first side surface portion. In regard to an up-down direction position of the sealing resin, the step is positioned between upper surfaces of the leads and the upper surface of the sealing resin.

In the preferred embodiment of the present invention, an amount of protrusion of the second side surface portion with respect to the first side surface portion is not more than 50 μm.

In the preferred embodiment of the present invention, the plurality of leads are constituted of a metal that contains copper.

In the preferred embodiment of the present invention, a material constituting the lead plating layers contains Pd.

In the preferred embodiment of the present invention, burrs are not formed on the outer end surfaces of the leads.

In the preferred embodiment of the present invention, an end surface shape of the outer end surface of each of the leads excluding the lead plating layer is substantially the same as a cross-sectional shape of the lead disposed inside the sealing resin.

In the preferred embodiment of the present invention, front surfaces of the lower surfaces of the plurality of leads excluding the lead plating layers are at higher height positions than the lower surface of the sealing resin.

In the preferred embodiment of the present invention, the plurality of leads are disposed so as to be aligned at intervals at each of both sides sandwiching the semiconductor chip.

In the preferred embodiment of the present invention, a die pad, which has an upper surface and a lower surface, with which the semiconductor chip is die bonded to the upper surface, and which is sealed by the sealing resin such that the lower surface is exposed at the lower surface of the sealing resin, and a die pad plating layer, arranged to improve solder wettability and formed on the lower surface of the die pad, are further included.

In the preferred embodiment of the present invention, a material constituting the die pad plating layer contains Pd.

In the preferred embodiment of the present invention, the front surfaces of the lower surfaces of the plurality of leads excluding the lead plating layers are at higher height positions than the lower surface of the sealing resin.

In the preferred embodiment of the present invention, the die pad is constituted of a metal that contains copper.

In the preferred embodiment of the present invention, the semiconductor device is a semiconductor device applying a QFN (Quad Flat Non-leaded Package).

In the preferred embodiment of the present invention, the semiconductor device is a semiconductor device applying an SON (Small Outlined Non-leaded Package).

A method for manufacturing a semiconductor device according to the present invention is a method for manufacturing a semiconductor device by cutting a semi-finished product that includes a lead frame, a semiconductor chip, and a sealing resin sealing the lead frame and the semiconductor chip. The lead frame includes a lattice-shaped supporting portion and a die pad and plurality of leads disposed inside each region surrounded by the supporting portion, each of the leads has a base end portion connected to the supporting portion and a free end portion formed to an elongate shape extending toward the die pad, and the sealing resin includes a lower surface and an upper surface, at a side opposite the lower surface, and seals the lead frame in a state where lower surfaces of the die pad, the plurality of leads, and the supporting portion are exposed at the lower surface of the sealing resin. The method includes a first step of forming a first groove portion, deeper than a thickness of the leads, from the lower surface side of the sealing resin by a dicing blade of a first width to remove the supporting portion and make end surfaces of the base end portions of the respective leads be exposed at a side surface of the groove portion, a second step of forming lead plating layers, arranged to improve solder wettability, on the exposed surfaces of the plurality of leads, and a third step of forming a second groove portion, exceeding the upper surface of the sealing resin, from a bottom portion of the first groove portion by a dicing blade of a second width smaller than the first width to cut the semi-finished product.

By the present manufacturing method, a semiconductor device with which reliability of connection with a mounting substrate can be improved can be manufactured.

In the preferred embodiment of the present invention, a step of etching the exposed surfaces of the plurality of leads between the first step and the second step is further included.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 5 is an illustrative sectional view of a manufacturing process of the semiconductor device of FIG. 1.

FIG. 22 is an illustrative sectional view of a mounting state of the semiconductor device shown in FIG. 17.

DETAILED DESCRIPTION OF THE PREFERRED EMBODIMENTS

Preferred embodiments of the present invention shall now be described in detail with reference to the attached drawings.

Figure 1:
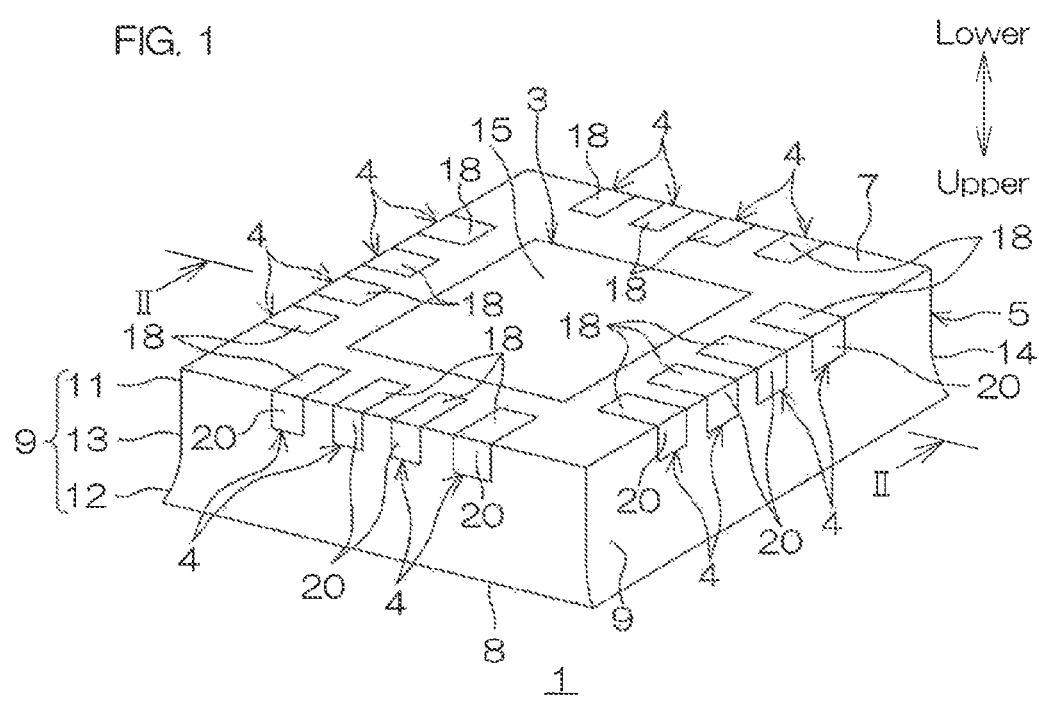
FIG. 1 is an illustrative perspective view of a semiconductor device according to a first preferred embodiment of the present invention.
Figure 2:
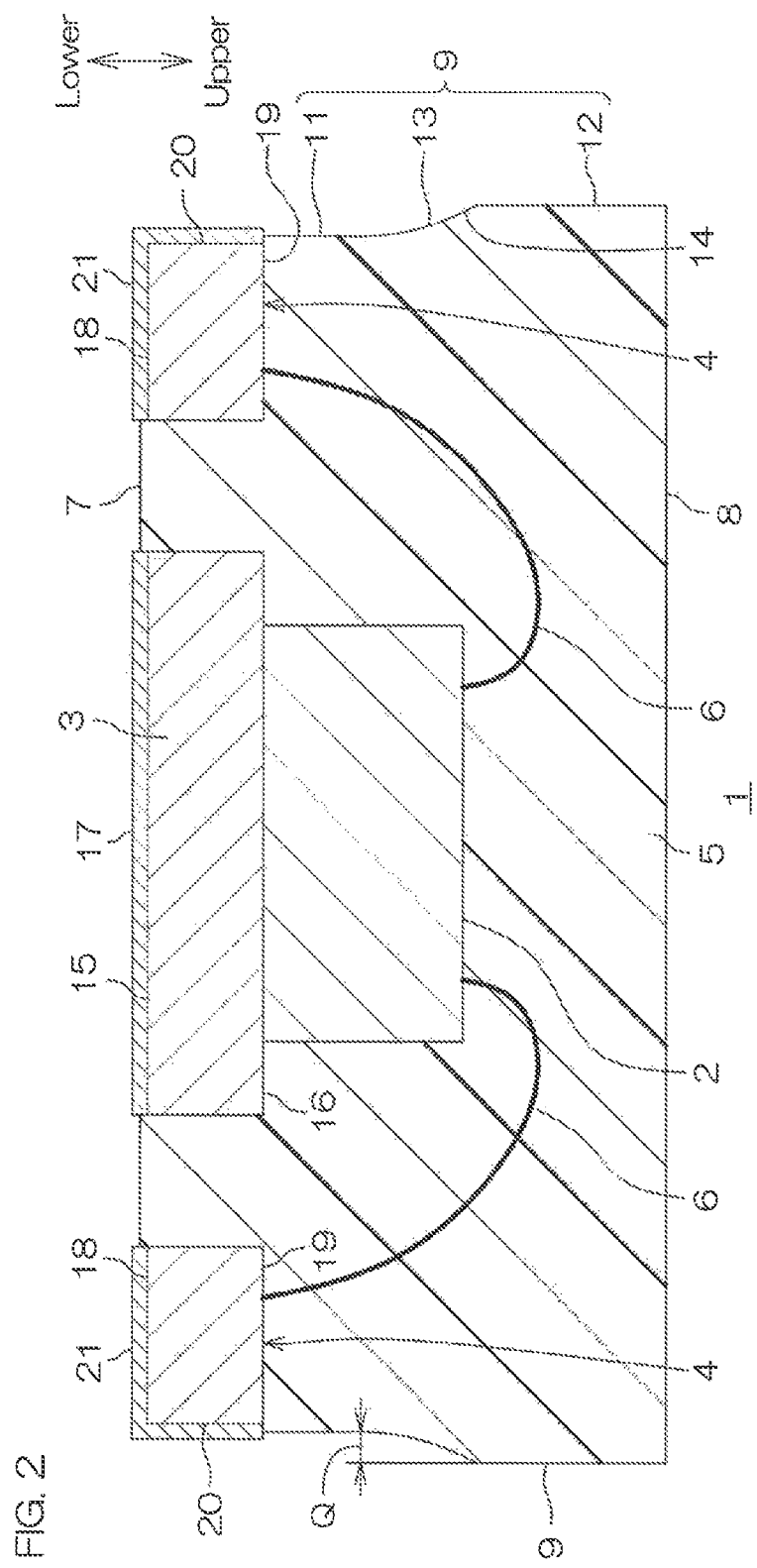
FIG. 2 is an illustrative sectional view taken along line II-II in FIG. 1.
Figure 3:
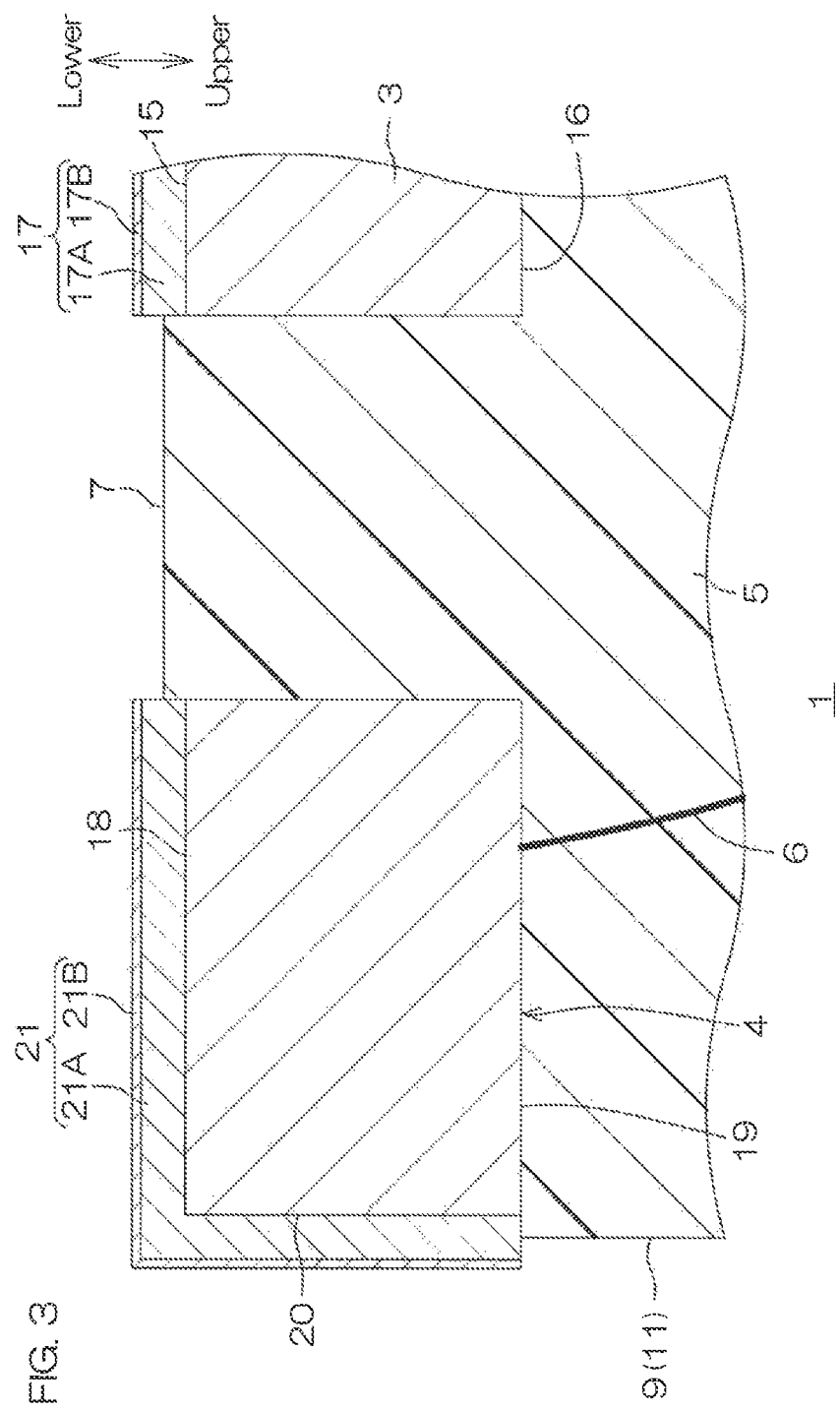
FIG. 3 is an enlarged view of a portion including a lead at one side and a portion of a die pad of FIG. 2.

FIG. 1 is an illustrative perspective view of a semiconductor device according to a first preferred embodiment of the present invention as viewed from obliquely above. Also, FIG. 2 is an illustrative sectional view taken along line II-II in FIG. 1. FIG. 3 is an enlarged view of a portion including a lead at one side and a portion of a die pad of FIG. 2.

The semiconductor device 1 is a semiconductor device applying a QFN. The semiconductor device 1 includes a semiconductor chip 2, a die pad 3, a plurality of leads 4, and a sealing resin 5. The die pad 3 is arranged to support the semiconductor chip 2. The plurality of leads 4 are electrically connected to the semiconductor chip 2. The sealing resin 5 seals the semiconductor chip 2, the die pad 3, and the plurality of leads 4.

The semiconductor chip 2 is die bonded onto the die pad 3 in a state where a front surface (device forming surface), at a side at which a function element is formed, is faced upward. Also, a plurality of pads (not shown) are formed on the front surface of the semiconductor chip 2. Each pad is formed by making a portion of a wiring layer be exposed from a surface protection film formed on a frontmost surface of the semiconductor chip 2. Each pad is connected to a lead 4 by a bonding wire 6.

The sealing resin 5 is constituted, for example, of an epoxy resin. As shown in FIG. 1, the sealing resin 5 is formed, for example, to a substantially rectangular parallelepiped shape that is flat in an up-down direction. The up-down direction is synonymous with a thickness direction of the semiconductor device 1. The sealing resin 5 of substantially rectangular parallelepiped shape has a lower surface 7, constituting a bottom surface, an upper surface 8, constituting a top surface, and side surfaces 9, each extending in a substantially perpendicular direction with respect to the lower surface 7 and the upper surface 8. The lower surface 7 and the upper surface 8 are both flat surfaces.

In a plan view, the lower surface 7 and the upper surface 8 are formed, for example, to substantially rectangular shapes. In a plan view, the upper surface 8 is larger than the lower surface 7 and an entirety of the lower surface 7 fits within an inner side of the upper surface 8.

The side surfaces 9 are continuous to the lower surface 7 and the upper surface 8. Specifically, the side surfaces 9 are formed over an entire periphery of the semiconductor device 1 excluding the lower surface 7 and the upper surface 8. In other words, the semiconductor device 1 has four side surfaces 9 continuous to four sides of each of the lower surface 7 and the upper surface 8.

Each side surface 9 has a first side surface portion 11, a second side portion 12, and a connecting portion 13. The four side surfaces 9 are formed over the entire periphery of the semiconductor device 1, and accordingly, the four each of the first side surface portions 11 and the second side surface portions 12, formed respectively at the four side surfaces 9, are formed over the entire periphery (entireties of the side surfaces 9) of the semiconductor device 1.

Each first side surface portion 11 is continuous to the lower surface 7 and extends substantially perpendicularly toward the upper surface 8. Each second side surface portion 12 is continuous to the upper surface 8 and extends substantially perpendicularly toward the lower surface 7. That is, each first side surface portion 11 is disposed near the lower surface 7 and each second side surface portion 12 is disposed near the upper surface 8.

At each side surface 9, the second side surface portion 12 protrudes further outward in a lateral direction (direction parallel to the lower surface 7 and the upper surface 8) than the first side surface portion 11. A protrusion amount Q (see FIG. 2) of the second side surface portion 12 with respect to the first side surface portion 11 is preferably not more than 50 μm.

At each side surface 9, the connecting portion 13 extends from an upper end of the first side surface portion 11 toward a lower end of the second side surface portion 12 while gradually spreading outward in the lateral direction (direction parallel to the lower surface 7 and the upper surface 8) and connects the first side surface portion 11 and the second side surface portion 12. A step 14 is thus formed between the first side surface portion 11 and the second side surface portion 12 at each side surface 9. The step 14 is positioned between an upper surface of each lead 4 and the upper surface 8 of the sealing resin 5.

As shall be described below, the die pad 3 and the leads 4 are formed from metal thin films constituted of copper or an alloy that contains copper.

The die pad 3 is rectangular in a plan view. As shown in FIG. 2 and FIG. 3, a lower surface 15 of the die pad 3 is exposed from the lower surface 7 of the sealing resin 5. The lower surface 15 of the die pad 3 is at a higher height position than the lower surface 7 of the sealing resin 5. At the lower surface 15 of the die pad 3 that is exposed from the lower surface 7 of the sealing resin 5, a die pad plating layer 17, arranged to improve solder wettability, is formed so as to cover substantially an entire surface of the lower surface 15. In FIG. 1, the die pad plating layer 17 is omitted for convenience of description. A lower surface of the die pad plating layer 17 projects downward with respect to the lower surface 7 of the sealing resin 5.

In the present preferred embodiment, the die pad plating layer 17 is constituted of an Ni (P) layer (P-containing Ni layer) 17A, formed on the lower surface 15 of the die pad 3, and a Pd (Au) layer (Au-containing Pd layer) 17B, formed thereon, as shown in FIG. 3. A thickness of the Ni (P) layer 17A is preferably not less than 0.4 μm and not more than 5 μm. In the present preferred embodiment, the thickness of the Ni (P) layer 17A is approximately 3 μm. A thickness of the Pd (Au) layer 17B is preferably not more than 0.5 μm. A flash plating of Au may be formed on a front surface of the Pd (Au) layer 17B. The semiconductor chip 2 is die bonded to an upper surface 16 of the die pad 3.

The same number each of the plurality of leads 4 are respectively provided at both sides in respective directions orthogonal to respective side surfaces of the die pad 3. The leads 4 facing each side surface of the die pad 3 are disposed at equal intervals in a direction parallel to the facing side surface.

Each lead 4 is formed to a rectangular shape in a plan view that is elongated in a direction orthogonal to aside surface of the die pad 3 (a direction of facing the die pad 3). With each lead 4, a lower surface 18 (connecting surface) thereof is exposed from the lower surface 7 of the sealing resin 5 and an outer end surface 20 in a length direction is exposed from a side surface 9 of the sealing resin 5. Corner portions defined by intersections of the lower surface 18 and the outer end surface 20 of the lead 4 are also exposed from the sealing resin 5. As shown in FIG. 2 and FIG. 3, the lower surfaces 18 of the leads 4 are at higher height positions than the lower surface 7 of the sealing resin 5. The outer end surfaces 20 of the leads 4 are recessed further inward in the lateral direction than the side surfaces 9 (first side surfaces 11) of the sealing resin 5.

A lead plating layer 21, arranged to improve solder wettability, is formed on the exposed surfaces of each lead 4 (the lower surface 18, the outer end surface 20, and the corner portions of each lead 4). In FIG. 1, the lead plating layers 21 are omitted for convenience of description. Lower surfaces of the lead plating layers 21, formed on the lower surfaces 18 of the leads 4, project downward with respect to the lower surface 7 of the sealing resin 5. Outer end surfaces of the lead plating layers 21, formed on the outer end surfaces 20 of the leads 4, protrude further outward in the lateral direction than the side surfaces 9 (first side surfaces 11) of the sealing resin 5.

In the present preferred embodiment, each lead plating layer 21 is constituted of an Ni (P) layer 21A, formed on the exposed surfaces of the corresponding lead 4, and a Pd (Au) layer 21B, formed thereon, as shown in FIG. 3. A thickness of the Ni (P) layer 21A is preferably not less than 0.4 μm and not more than 5 μm. In the present preferred embodiment, the thickness of the Ni (P) layer 21A is approximately 3 μm. A thickness of the Pd (Au) layer 21B is preferably not more than 0.5 µm. A flash plating of Au may be formed on a front surface of the Pd (Au) layer 21B.

The lower surface 18 of each lead 4 (lower surface of each lead plating layer 21) functions as an external terminal bonded to a land on a mounting substrate (wiring substrate). On the other hand, an upper surface 19 of each lead 4 is sealed inside the sealing resin 5. The upper surface 19 of the lead 4 serves a role of an inner lead and a bonding wire 6 is connected thereto.

Figure 4:
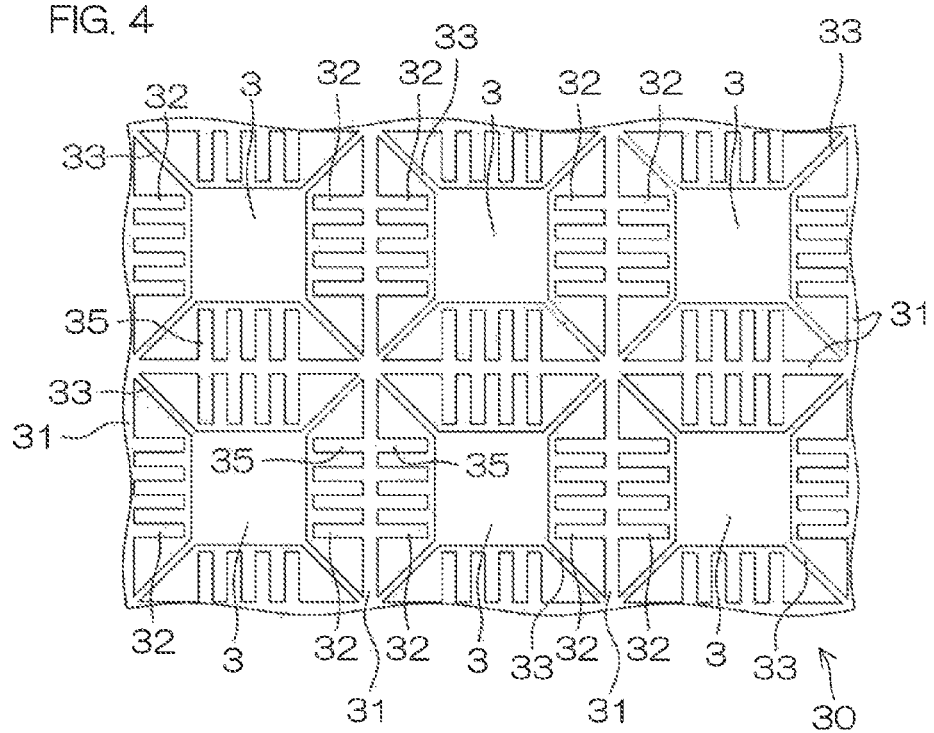
FIG. 4 is a bottom view of a portion of a lead frame used in manufacturing the semiconductor device of FIG. 1.

FIG. 4 is a bottom view of a portion of a lead frame used in manufacturing the semiconductor device 1.

As shall be described below, the semiconductor device 1 is manufactured by a MAP method using the lead frame 30. The lead frame 30 is formed by processing a thin plate of a metal that contains copper (for example, a copper alloy having copper as a main component and obtained by adding several tenth % to several % of an element, such as Co, Fe, Ni, Cr, Sn, Zn, etc., with respect to the copper).

The lead frame 30 integrally includes a lattice-shaped supporting portion 31, die pads 3, disposed inside respective rectangular regions surrounded by the supporting portion 31, and a plurality of leads (lead constituent members) 32 disposed in peripheries of the die pads 3.

The die pads 3 are supported by the supporting portion 31 by means of suspension leads 33 installed across the respective corner portions and the supporting portion 31. With each lead 32, an end portion at a side opposite the die pad 3 side is connected to the supporting portion 31. Between mutually adjacent die pads 3, the respective leads 32 disposed in the periphery of one die pad 3 and the respective leads 32 disposed in the periphery of the other die pad 3 face each other across the supporting portion 31 in length directions of the leads 32 and extend in straight lines.

FIG. 5 to FIG. 15 are illustrative sectional views or side views of a method for manufacturing the semiconductor device 1.

The method for manufacturing the semiconductor device 1 shall now be described. First, the lead frame 30 is prepared as shown in FIG. 5. In FIG. 5 to FIG. 15, only a section plane of the lead frame 30 is shown.

Figure 6:
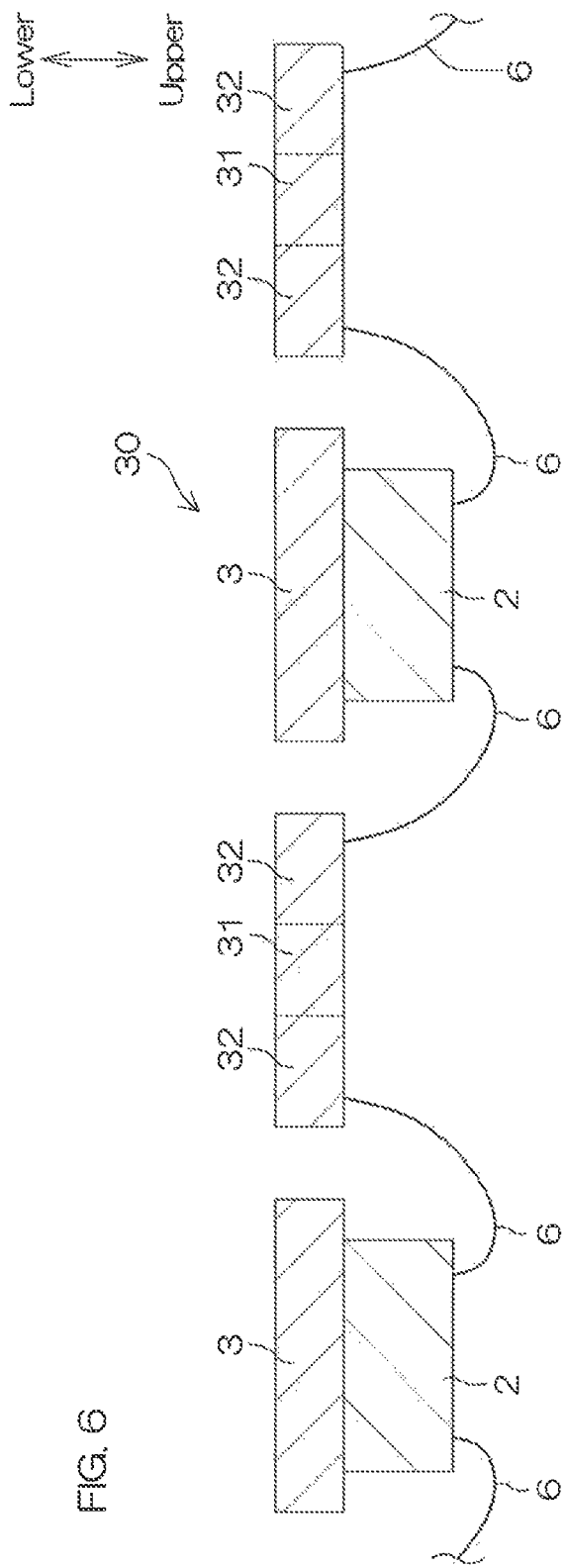
FIG. 6 is an illustrative sectional view of a step subsequent to that of FIG. 5.

Next, as shown in FIG. 6, the semiconductor chips 2 are die bonded onto the die pads 3 of the lead frame 30 via a bonding material (not shown) constituted, for example, of a high melting point solder (solder with a melting point of not less than 260° C.), silver paste, etc. Next, the pads of the semiconductor chips 2 and upper surfaces of the leads 32 are connected by bonding wires 6 constituted of thin wires, for example, of gold, copper, or aluminum (bonding step).

Figure 7:
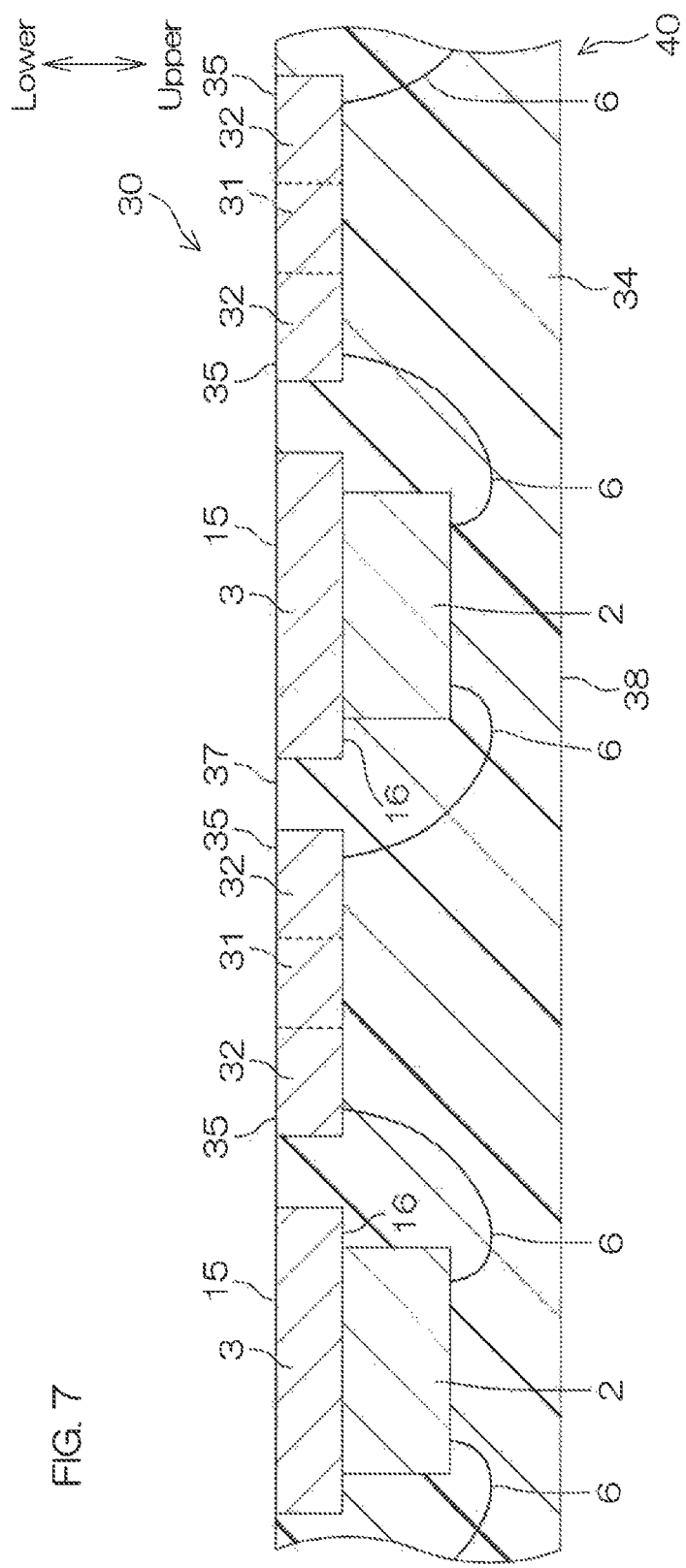
FIG. 7 is an illustrative sectional view of a step subsequent to that of FIG. 6.

Thereafter, the lead frame 30 is placed in a die for sealing and, as shown in FIG. 7, the lead frame 30 and the semiconductor chips 2 are sealed by a sealing resin 34 such that the lower surfaces 15 of the die pads 3, lower surfaces 35 of the leads 32, and a lower surface of the supporting portion 31 are exposed (resin sealing step). The sealing resin is constituted, for example, of an epoxy resin.

As a method for sealing by the sealing resin 34, for example, a method, such as a transfer molding method, etc., is adopted. In the transfer molding method, a pair of dies having cavities for forming the sealing resin 34 are used and the lead frame 30 is sandwiched between the pair of dies. Interiors of the cavities are then filled with a molten resin and sealing can be accomplished by cooling and solidifying the resin.

When the resin sealing step ends, a semi-finished product 40 is completed. The semi-finished product 40 includes the lead frame 30, the semiconductor chips 2, and the sealing resin 34 sealing these. The sealing resin 34 constitutes a plate shape covering the lead frame 30. The sealing resin 34 includes a lower surface 37 constituting a bottom surface thereof and an upper surface 38 constituting a top surface thereof. The lower surfaces 15 of the die pads 3, the lower surfaces 35 of the leads 32, and the lower surface of the supporting portion 31 are exposed from the lower surface 37 of the sealing resin 34. The lower surfaces 15 of the die pads 3 and the lower surfaces 35 of the leads 32 are flush with the lower surface of the sealing resin 34.

Thereafter, a step of cutting the semi-finished product 40 to cut out the semiconductor devices 1 individually is performed. When this step is completed, the sealing resin 34 becomes the sealing resin 5 of each individual semiconductor device 1 (see FIG. 15). At the same time, the respective leads 32 become the leads 4 of each individual semiconductor device 1 (see FIG. 15).

Figure 8:
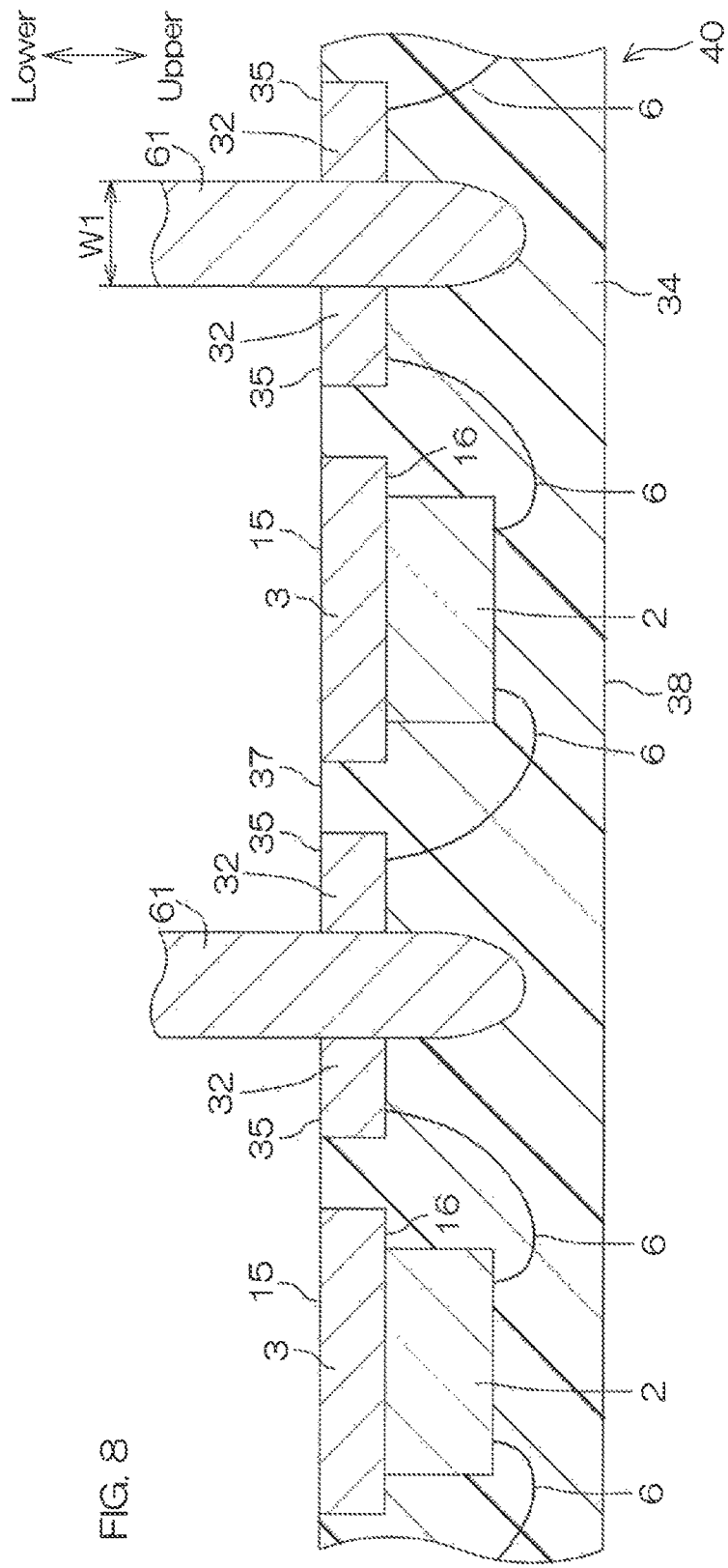
FIG. 8 is an illustrative sectional view of a step subsequent to that of FIG. 7.
Figure 14:
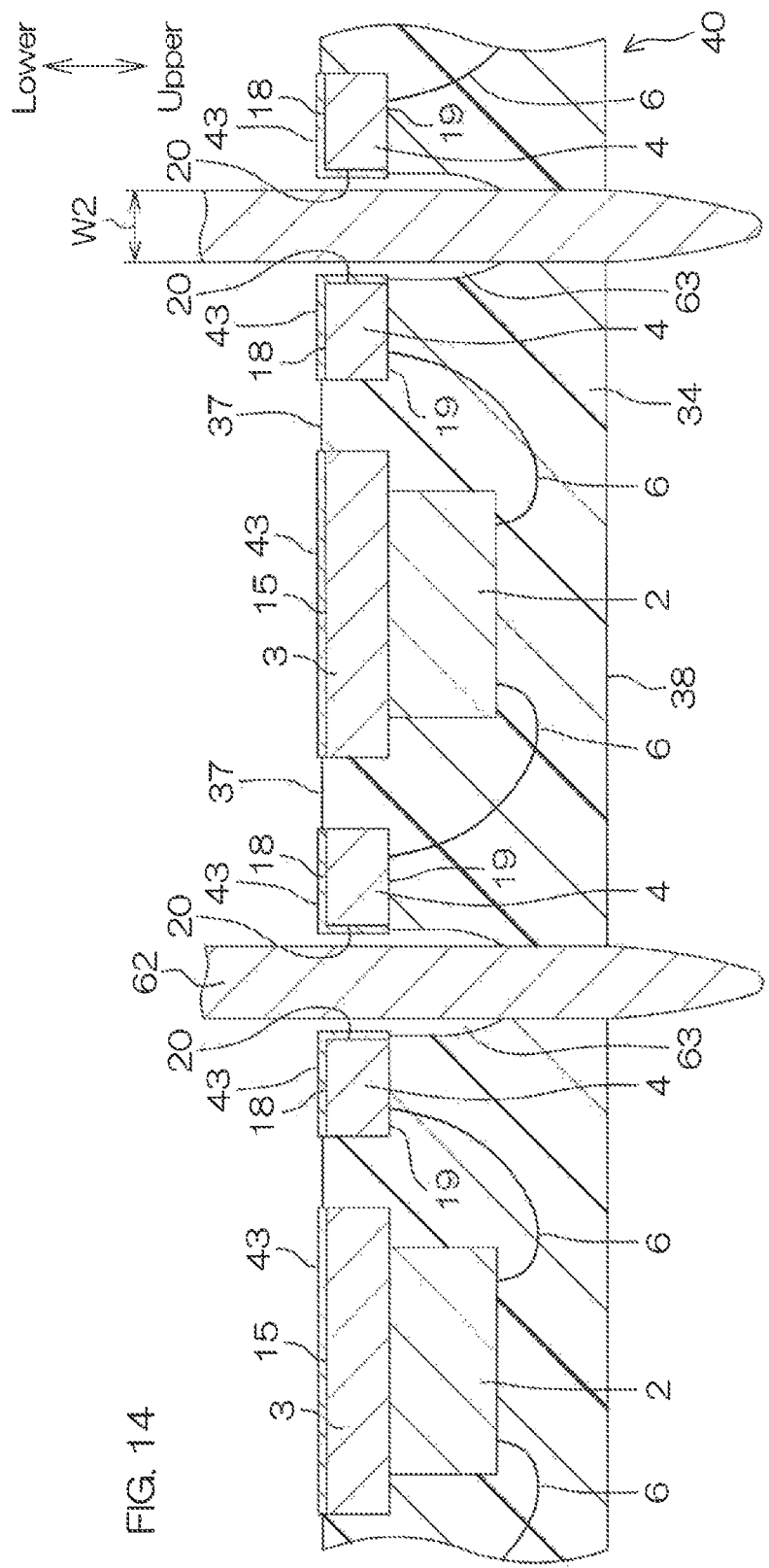
FIG. 14 is an illustrative sectional view of a step subsequent to that of FIG. 13.

In the step of cutting out the semiconductor devices 1 individually, first dicing blades 61 having a first width W1 and second dicing blades 62 having a second width W2 narrower than the first dicing blades 61 are used (see FIG. 8 and FIG. 14). In the present preferred embodiment, the first width W1 is, for example, approximately 300 µm and the second width W2 is smaller than the first width W1 and is, for example, approximately 240 µm. The first dicing blades 61 and the second dicing blades 62 are both disc-shaped grindstones and each has a cutting teeth portion at a peripheral end surface.

First, as shown in FIG. 8, the first dicing blades 61 are moved along dicing lines (unillustrated) set on the supporting portion 31 of the lead frame 30. Each first dicing blade 61 moves along the corresponding dicing line while rotating around a central axis of its disc shape. In this process, the first dicing blade 61 is inserted from the lower surface side of the supporting portion 31 (the lower surface 37 side of the sealing resin 34). The supporting portion 31, the sealing resin 34 on the supporting portion 31, base end portions of the leads 32 that are present in regions of a predetermined width at both sides of the supporting portion 31, and the sealing resin 34 on the base end portions of the leads 32 are thereby removed (first dicing step).

Figure 9:
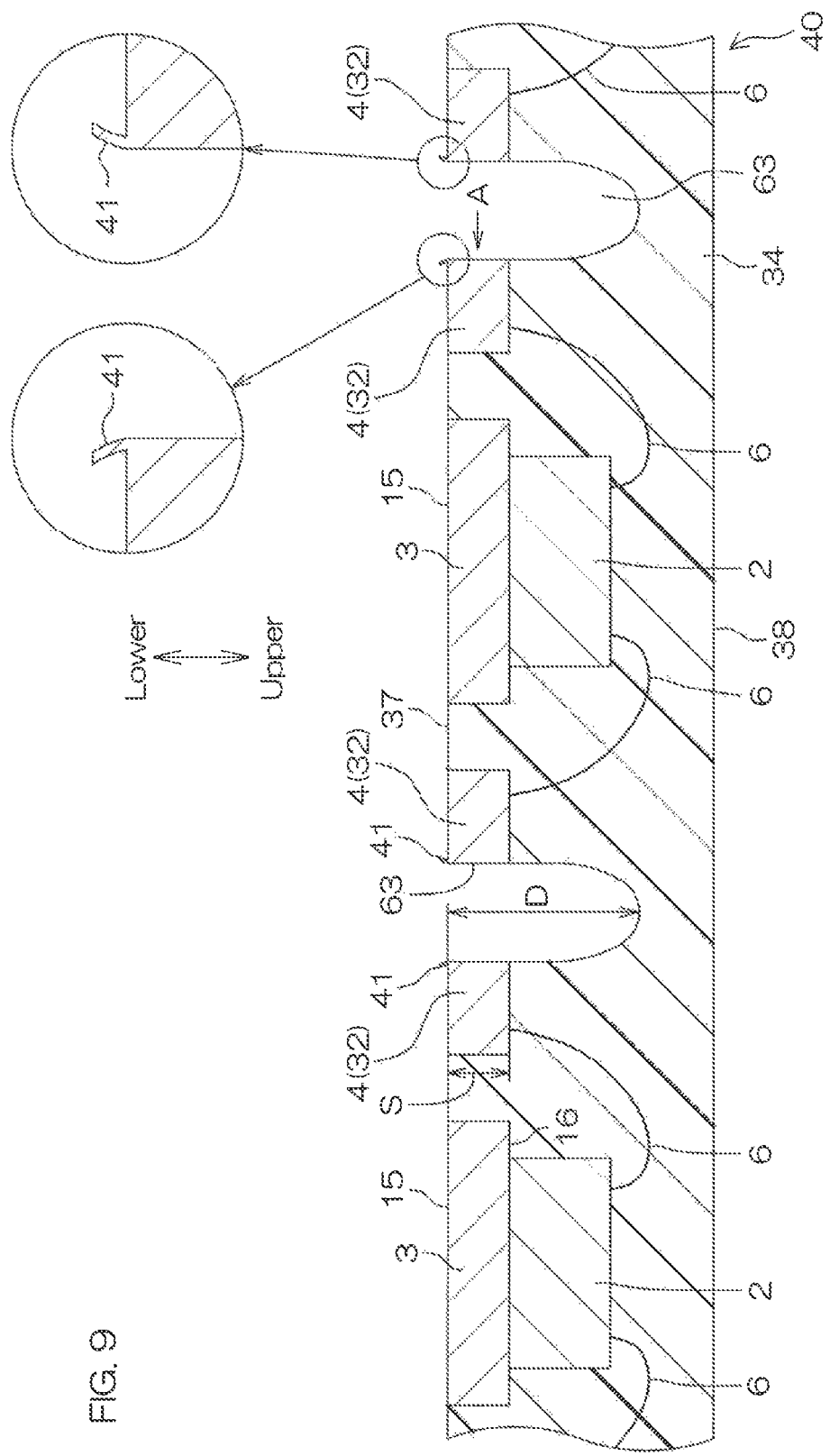
FIG. 9 is an illustrative sectional view of a step subsequent to that of FIG. 8.

As a result of the first dicing step, first groove portions 63 of substantially the same width as the first dicing blades 61 are formed at courses through which the first dicing blades 61, passed as shown in FIG. 9. Each first groove portion 63 is a groove that is recessed from the lower surface 37 toward the upper surface 38 side of the sealing resin 34. A cross-sectional shape of a cutting edge of each first dicing blade 61 is a semicircle that bulges to an outer side and therefore a bottom surface of the first groove portion 63 is formed to a groove shape having an arcuate cross section that bulges toward the upper surface 38 of the sealing resin 34.

A bottom of each first groove portion 63 is at an intermediate position in the up-down direction (thickness direction) of the sealing resin 34 and the first groove portion 63 does not penetrate through the sealing resin 34. However, the first groove portion 63 penetrates through the supporting portion 31 and the base end portions of the leads 32. A depth D of the first groove portion 63 is greater than a thickness S of each lead 32.

By the first groove portions 63 being formed in the first dicing step, the respective leads 32 are cut off from the supporting portion 31 and become the leads 4. The outer end surface of each lead 4 is in a state of being flush with a side wall of the corresponding first groove portion 63 and is exposed from a wall surface thereof. In the process of forming the first groove portions 63, side surfaces of the first dicing blades 61 contact the leads 32. The leads 32 are thus extended partially by being drawn out by the side surfaces of the first dicing blades 61 and therefore burrs form at end portions of the leads 32. For example, as shown in FIG. 9, downwardly projecting burrs 41 form at lower edges of the outer end surfaces of the respective leads 4.

Figure 10:
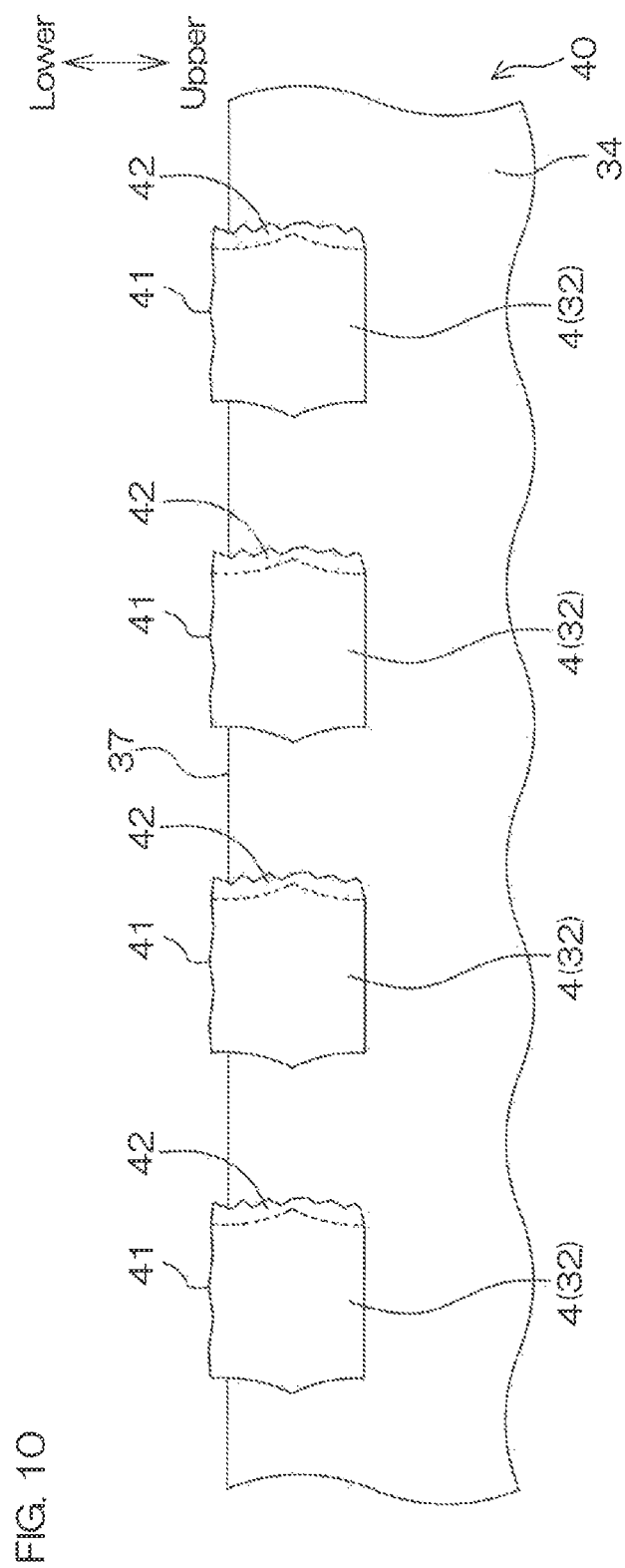
FIG. 10 is an illustrative side view viewed from a direction of an arrow A of FIG. 9.

Also as shown in FIG. 10, a burr 42 that is elongated in a lateral direction is formed at one-side portion of the outer end surface of each lead 4. FIG. 10 is a side view as viewed from a direction of an arrow A of FIG. 9. The burr 42 is formed thinly above a side surface of the corresponding first groove portion 63. In the present preferred embodiment, the lead frame 30 is manufactured by etching a thin plate of metal. Therefore, although a transverse sectional shape (end surface shape) of each lead 4 is supposed to be a rectangular shape, it constitutes a shape that increases in width toward a thickness center portion. Metal chips and resin chips that are generated during the first dicing step are washed off by flowing water from a water supply nozzle (unillustrated) during the first dicing step.

Figure 11:
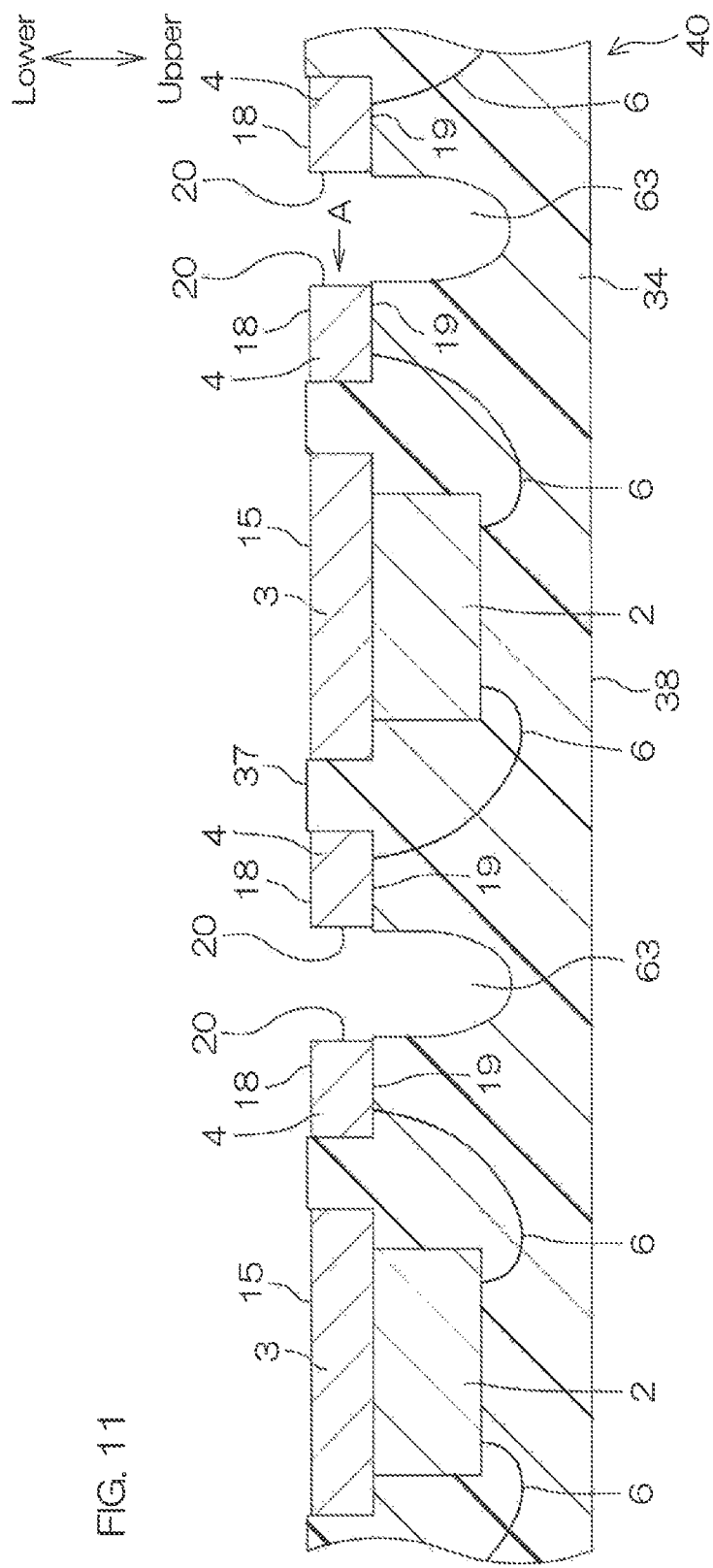
FIG. 11 is an illustrative sectional view of a step subsequent to that of FIG. 9.
Figure 12:
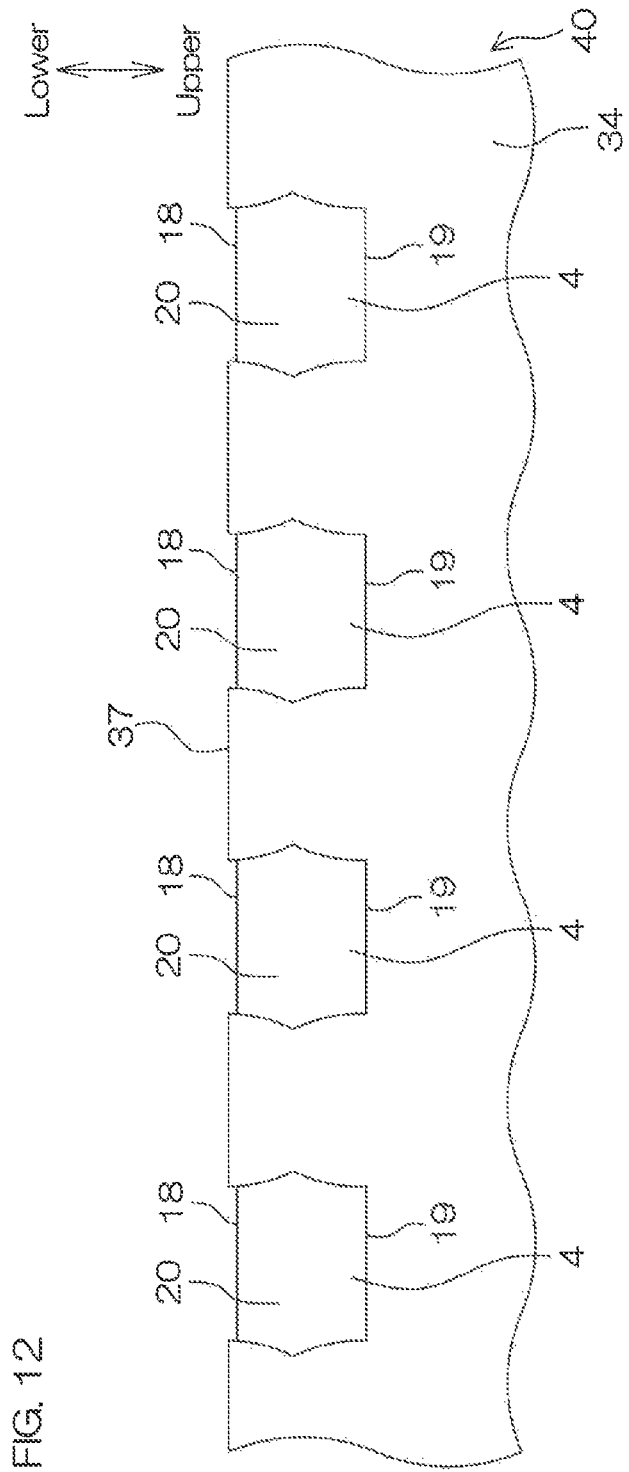
FIG. 12 is an illustrative side view viewed from a direction of an arrow A of FIG. 11.

Next, the exposed surfaces of the respective leads 4 and the exposed surfaces of the die pads 3 are etched. The exposed surfaces (the lower surfaces and the outer end surfaces) of the respective leads 4 and the exposed surfaces (the lower surfaces) of the die pads 3 are thereby chemically polished, as shown in FIG. 11 and FIG. 12. The burrs 41 formed at the lower edges of the outer end surfaces of the respective leads 4 are thereby removed and, at the same time, the burrs 42 formed at one-side portions of the outer end surfaces 20 of the respective leads 4 are removed. Also, the lower surfaces 18 of the respective leads 4 and the lower surfaces 15 of the die pads 3 are at higher height positions than the lower surface 37 of the sealing resin 34. Further, the outer end surface 20 of each lead 4 is recessed further into the interior of the sealing resin 34 side in the lateral direction than the side surface of the corresponding first groove portion 63.

Figure 13:
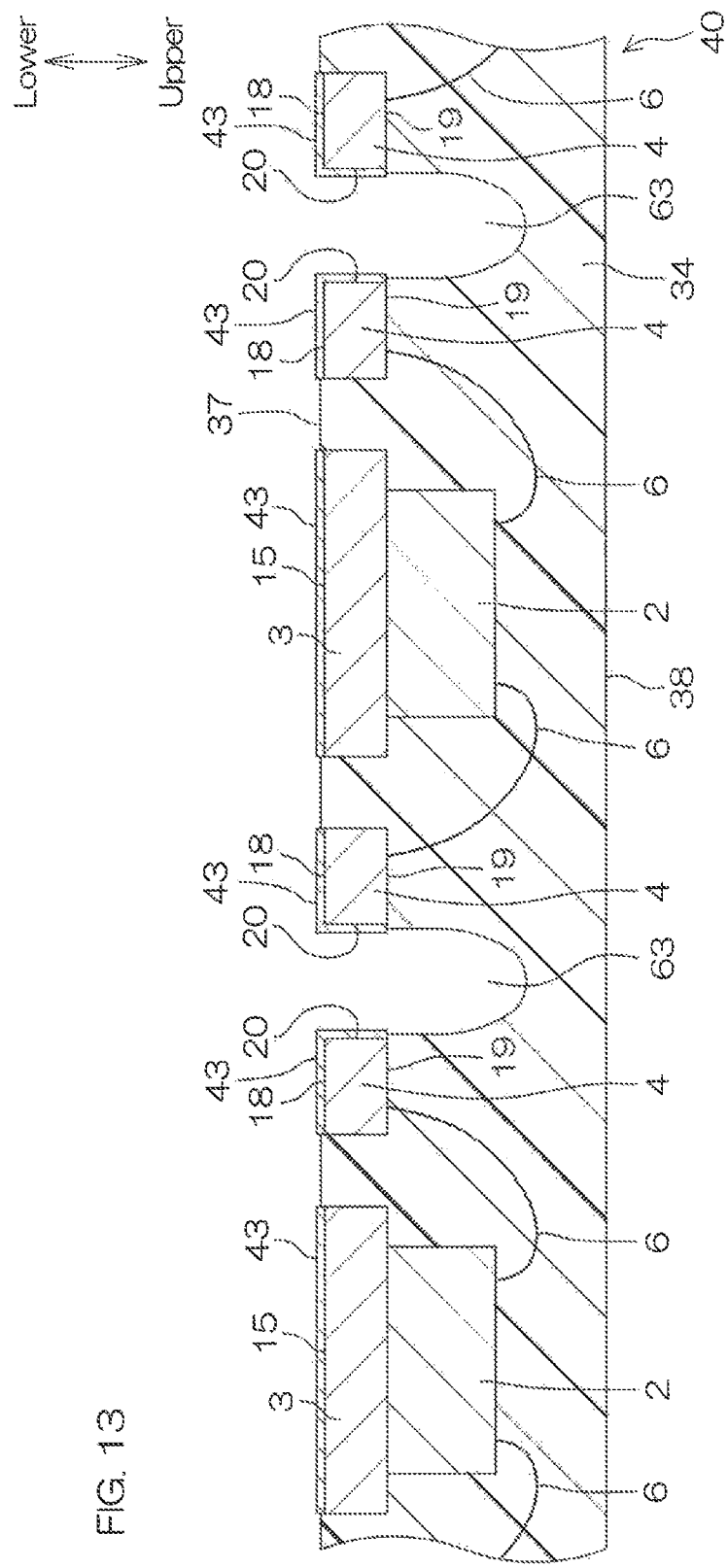
FIG. 13 is an illustrative sectional view of a step subsequent to that of FIG. 11.

Next, as shown in FIG. 13, plating layers 43, arranged to improve solder wettability, are formed on the lower surfaces 15 of the die pads 3 and the lower surfaces 18 and the outer end surfaces 20 of the leads 4 (plating step). In the present preferred embodiment, the plating layers 43 have laminated structures of Ni (P) plating layers, formed by an electroless plating method on the lower surfaces 15 of the die pads 3 and the lower surfaces 18 and the outer end surfaces 20 of the leads 4, and Pd (Au) plating layers, formed on the Ni (P) plating layers by the electroless plating method. The forming of the plating layers 43 may be performed by an electroplating method.

Next, as shown in FIG. 14, the second dicing blades 62 are moved along the dicing lines (unillustrated) along which the first dicing blades 61 passed in the first dicing step. Each second dicing blade 62 moves, while rotating around the central axis of its disc shape, along the dicing line along which the first dicing blade 61 passed in the first dicing step. In this process, the second dicing blade 62 is inserted into the corresponding first groove portion 63.

Figure 15:
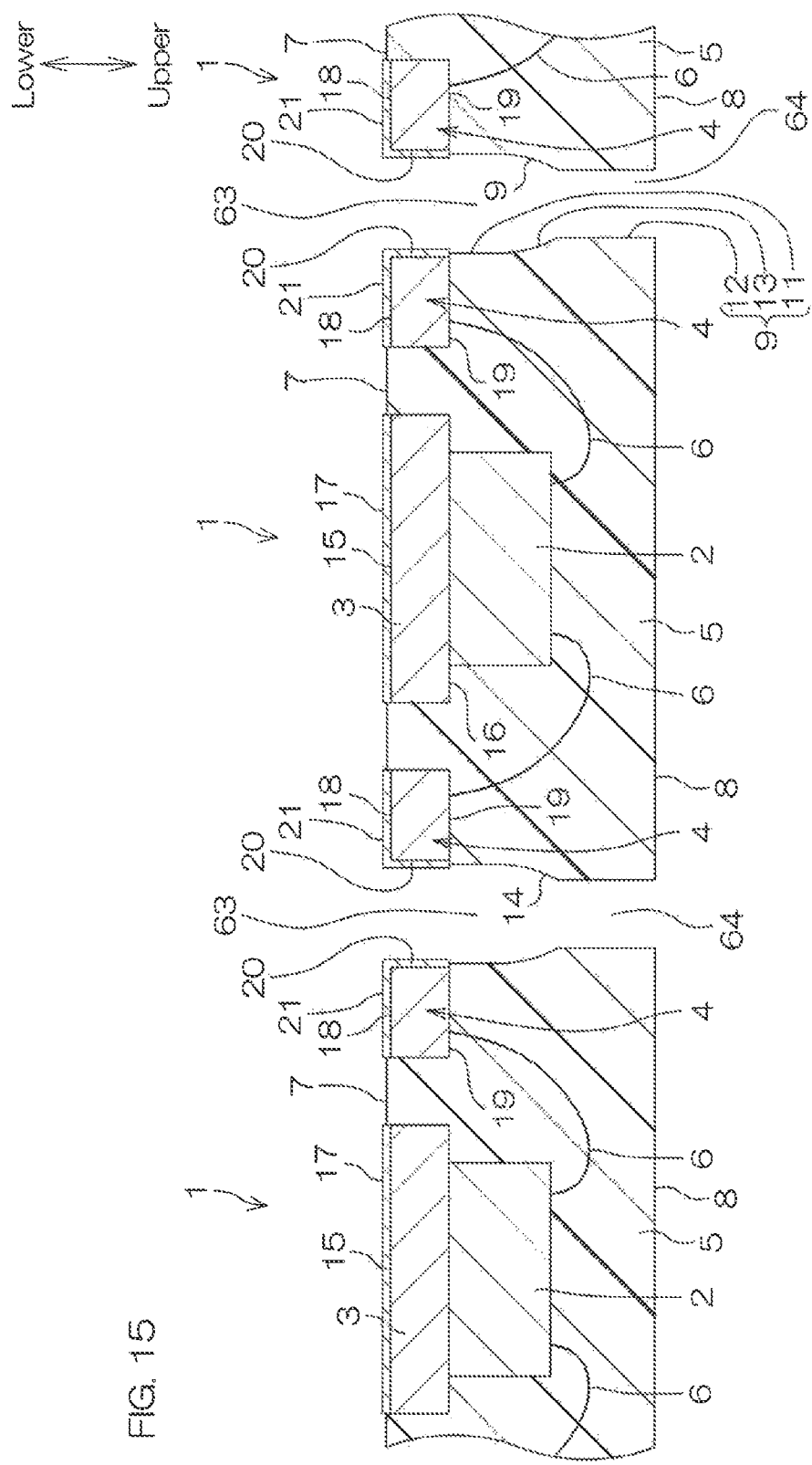
FIG. 15 is an illustrative sectional view of a step subsequent to that of FIG. 14.

The second dicing blades 62 pass through width-direction central portions of the bottoms of the first groove portions 63 without contacting the side walls of the first groove portions 63. In this process, the second dicing blades 62 cut the sealing resin 34 present at positions deeper than the bottoms of the first groove portions 63. A cutting teeth portion of each second dicing blade 62 penetrates through the sealing resin 34. The sealing resin 34 present at the positions deeper than the bottoms of the first groove portions 63 is thereby removed (second dicing step). As a result of the second dicing step, second groove portions 64 of substantially the same width as the second dicing blades 62 are formed at courses (the central portions of the bottoms of the first groove portions 63) through which the second dicing blades 62, passed as shown in FIG. 15. The groove width of the second groove portions 64 is narrower than the groove width of the first groove portions 63. The first groove portions 63 and the second groove portions 64 integrally constitute stepped grooves. Resin chips generated during the second dicing step are washed off by flowing water from the water supply nozzle (unillustrated) during the second dicing step.

By the second groove portions 64 being formed, the sealing resin 34 is cut apart at both sides of each first groove portion 63 and second groove portion 64 to become the sealing resins 5. Individual pieces of the semiconductor devices 1 are thereby obtained. In each semiconductor device 1, the plating layer 43 on the lower surface 15 of the die pad 3 (see FIG. 14) becomes the die pad plating layer 17, and the plating layers 43 on the lower surfaces 35 of the leads 32 (see FIG. 14) become the lead plating layers 21. The wall surfaces (excluding the bottom surfaces with the arcuate cross sections) of the side walls of the first groove portions 63 become the first side surface portions 11 of the side surfaces 9 in the semiconductor device 1. Wall surfaces of side walls of the second groove portions 64 become the second side surface portions 12 of the side surfaces 9 in the semiconductor device 1. The bottom surfaces having the arcuate cross sections of the first groove portions 63 become the connecting portions 13 of the side surfaces 9 in the semiconductor device 1.

Figure 16:
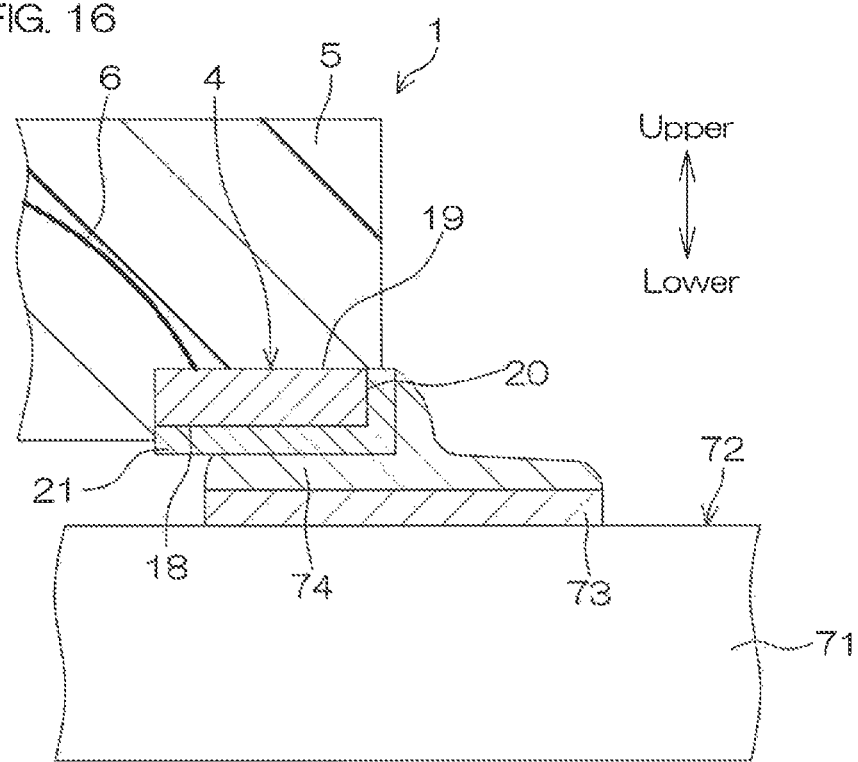
FIG. 16 is an illustrative sectional view of a mounting state of the semiconductor device shown in FIG. 1.

FIG. 16 is an illustrative sectional view of a mounting state of the semiconductor device shown in FIG. 1.

The semiconductor device 1 that has been obtained as described above is surface-mounted with the lower surfaces 18 of the leads 4 facing a front surface 72, that is, a surface of a mounting substrate (wiring substrate) 71 at which lands 73 are formed.

Cream solder 74 is coated on each land 73. In surface-mounting the semiconductor device 1 onto the mounting substrate 71, the lower surfaces 18 of the leads 4 are bonded to the lands 73 via the cream solder 74 and the lead plating layers 21.

The lead plating layers 21, arranged to improve solder wettability, are formed on the lower surfaces 18 of the leads 4 and the outer end surfaces 20 of the leads 4, and therefore, when the lower surfaces 18 of the leads 4 become bonded to the cream solder 74 on the land 73 in the above process, the cream solder 74 creepingly adheres closely to the outer end surfaces 20 of the leads 4. Consequently, a mounting strength of the semiconductor device 1 and the mounting substrate 71 can be improved and reliability of connection can be improved.

Also, by the above, so-called solder fillets are formed on the outer end surfaces 20 of the leads 4 and therefore appearance inspection of a state of bonding (soldering) of the leads 4 and the lands 73 can be performed readily.

Also, with the preferred embodiment described above, by the first dicing step, the respective leads 32 are cut off from the supporting portion 31 to become the leads 4 and the outer end surfaces 20 of the respective leads 4 become exposed from the wall surfaces of the first groove portions 63. In this state, although the first groove portions 63 are formed from the lower surface 37 side in the sealing resin 34 of the semi-finished product 40, the semi-finished product 40 is not separated completely. The outer end surfaces 20 of the respective leads 4 are thus exposed in a state where the semi-product 40 is not completely separated into the individual semiconductor devices and therefore forming of the plating layers 43 (lead plating layers 21) on the outer end surfaces 20 of the respective leads 4 is made easy. Also, forming of the plating layers 43 (lead plating layers 21) on the lower surfaces 18 of the respective leads 4, forming of the plating layers 43 (die pad plating layers 17) on the lower surfaces 15 of the die pads 3, and the forming of the plating layers 43 (lead plating layers 21) on the outer end surfaces 20 of the respective leads 4 can be performed at the same time.

As mentioned above, the burrs 41 and 42 form at the end portions of the leads 4 due to the first dicing step. When such a burr is formed, the burr contacts a land 73 on the mounting substrate 71 during the mounting of the semiconductor device 1 onto the mounting substrate 71 shown in FIG. 16 and the semiconductor device 1 becomes lifted up from the mounting substrate 71 at the portion of the burr. When reflow is performed in this state, a mounting failure, such as a connection failure between a lead 4 and the land 73, etc., may occur due to thermal warpage of the mounting substrate 71.

However, with the manufacturing method described above, the exposed surfaces of the leads 4 are etched after the first dicing step and therefore the burrs 41 and 42 formed due to the first dicing step are removed. Therefore with the semiconductor devices 1 manufactured by the manufacturing method described above, the burrs 41 and 42 are not present, and occurrence of a mounting failure of a lead 4 and land 73 due to a burr can thus be prevented.

Figure 17:
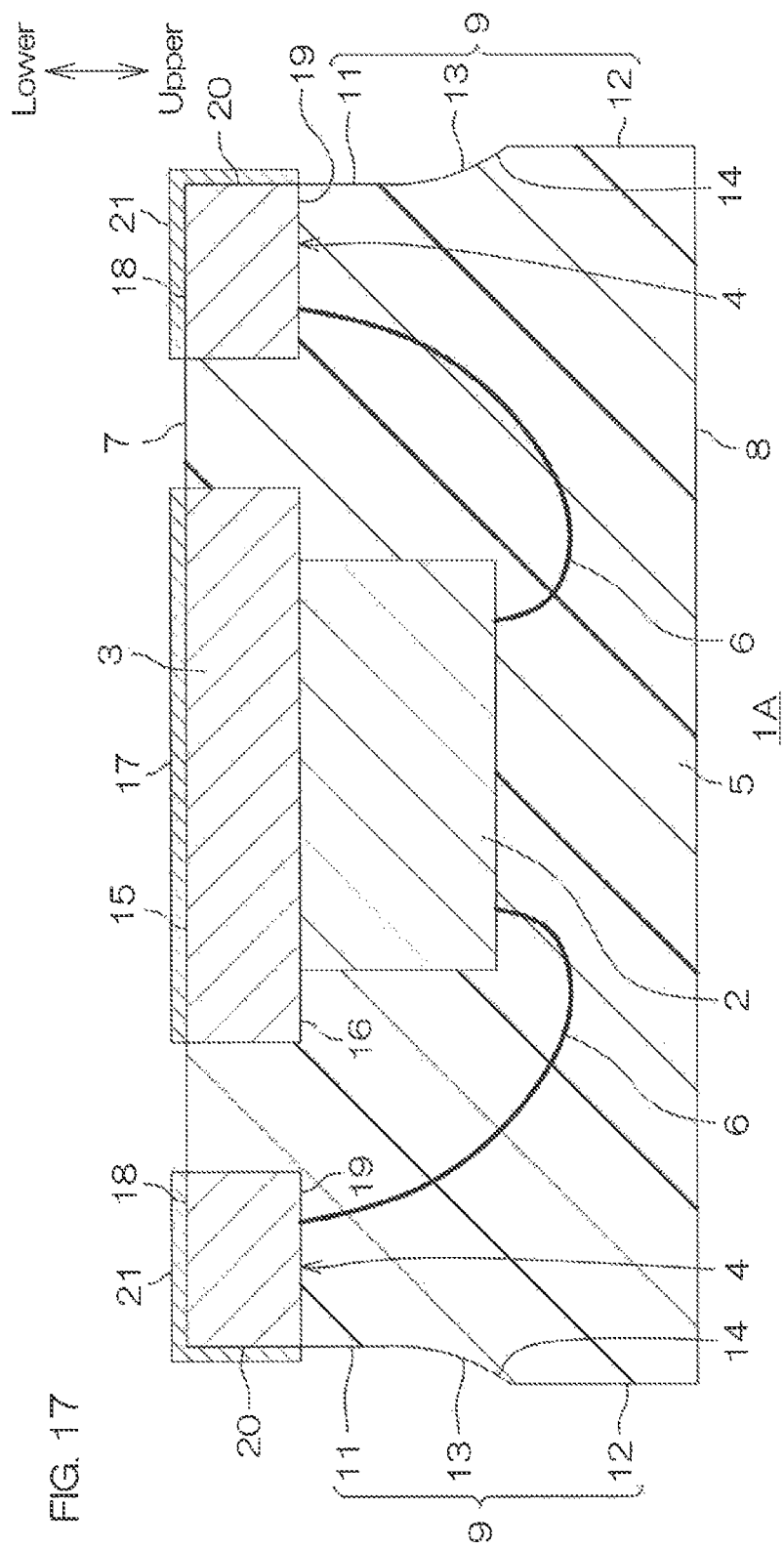
FIG. 17 is an illustrative sectional view of a semiconductor device according to a second preferred embodiment of the present invention.
Figure 18:
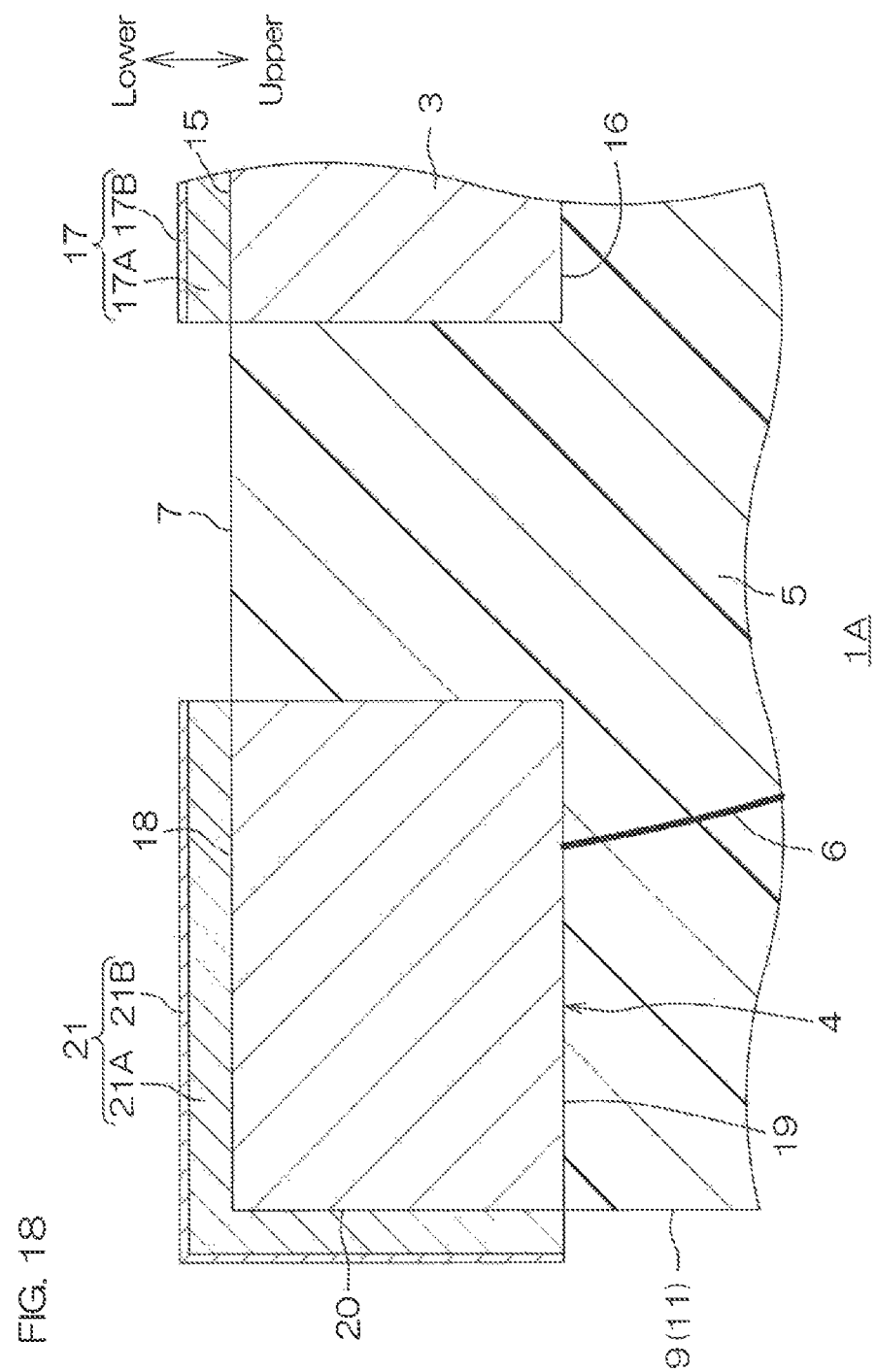
FIG. 18 is an enlarged view of a portion including a lead at one side and a portion of a die pad of FIG. 17.

FIG. 17 is an illustrative sectional view of a semiconductor device according to a second preferred embodiment of the present invention and shows a section plane corresponding to FIG. 2. FIG. 18 is an enlarged view of a portion including a lead at one side and a portion of a die pad of FIG. 17. In FIG. 17 and FIG. 18, portions corresponding to respective portions indicated in FIG. 2 and FIG. 3 above are indicated by attaching the same reference symbols.

The arrangement of the semiconductor device 1A according to the second preferred embodiment is substantially the same as the arrangement of the semiconductor device 1 according to the first preferred embodiment described above. In comparison to the semiconductor device 1 according to the first preferred embodiment, the semiconductor device 1A according to the second preferred embodiment differs in manufacturing method. Due to the difference in manufacturing method, the lower surface 15 of the die pad 3 is flush with the lower surface 7 of the sealing resin 5 with the semiconductor device 1A according to the second preferred embodiment as shown in FIG. 17 and FIG. 18. Also, the lower surfaces 18 of the leads 4 are flush with the lower surface 7 of the sealing resin 5. Also, the outer end surfaces 20 of the leads 4 are flush with the side surfaces 9 of the sealing resin 5.

Figure 19:
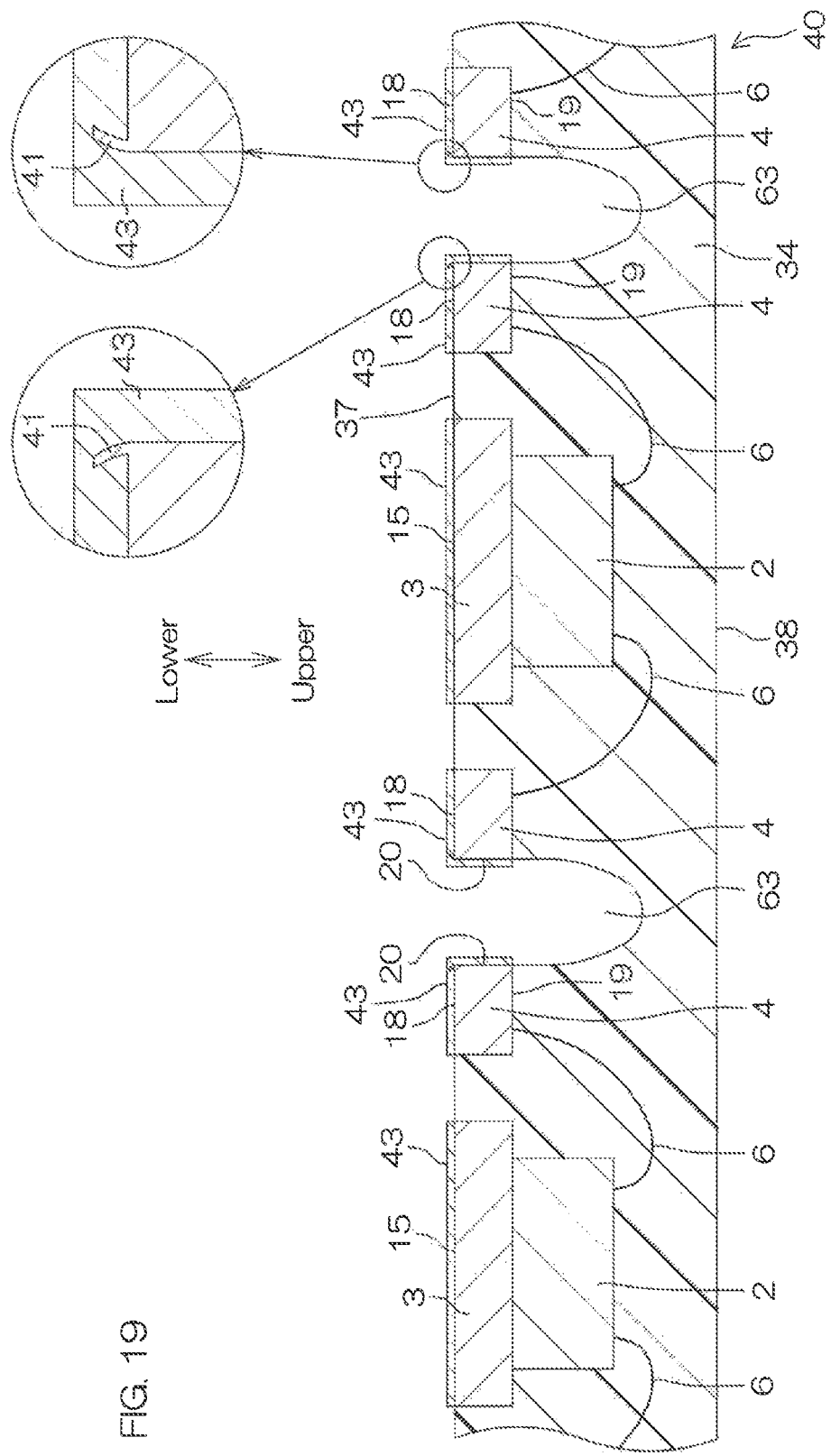
FIG. 19 is an illustrative sectional view of a manufacturing process of the semiconductor device of FIG. 17.
Figure 20:
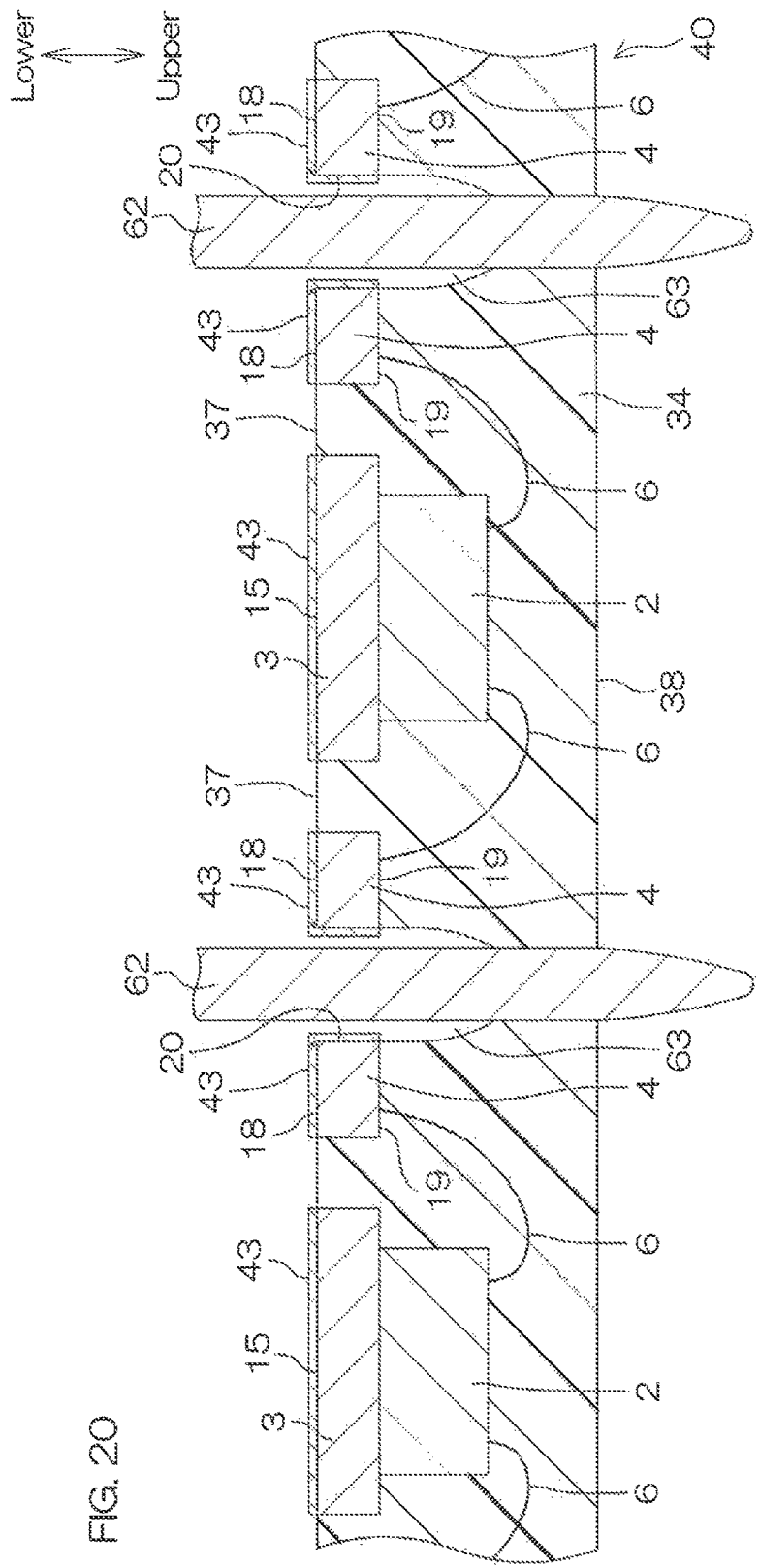
FIG. 20 is an illustrative sectional view of a step subsequent to that of FIG. 19.
Figure 21:
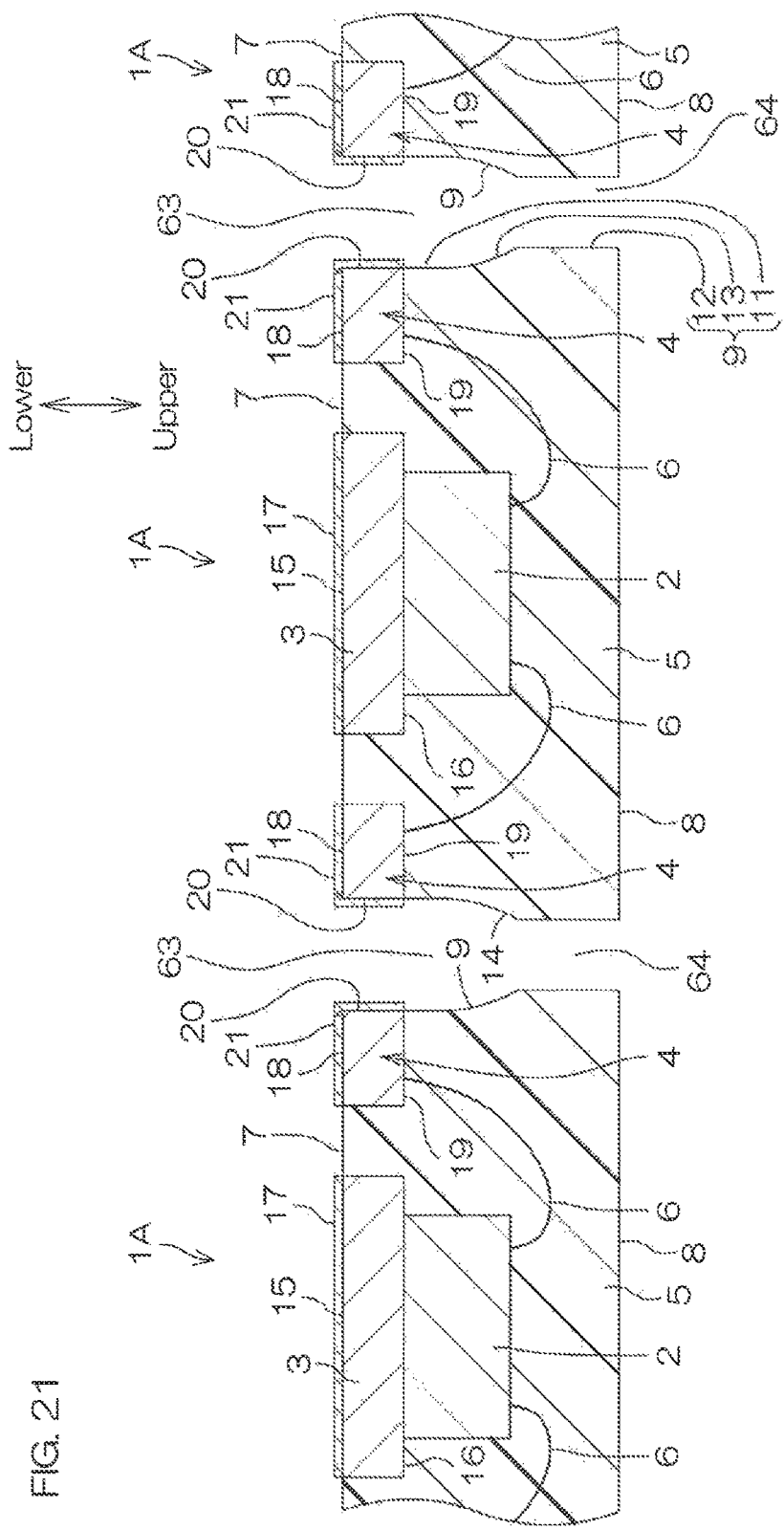
FIG. 21 is an illustrative sectional view of a step subsequent to that of FIG. 20.

FIG. 19 to FIG. 21 are illustrative sectional views or side views of a method for manufacturing the semiconductor device 1A.

With the method for manufacturing the semiconductor device 1A according to the second preferred embodiment (may hereinafter be referred to at times as the "second manufacturing method"), the steps up to the first dicing step described above are performed in the same manner as in the above-described method for manufacturing the semiconductor device 1 according to the first preferred embodiment (may hereinafter be referred to at times as the "first manufacturing method").

That is, first, as shown in FIG. 6, the semiconductor chips 2 are die bonded onto the die pads 3 of the lead frame 30 via the bonding material (not shown) constituted, for example, of a high melting point solder, silver paste, etc. Thereafter, the pads of the semiconductor chips 2 and the upper surfaces of the leads 32 are connected by the bonding wires 6 (bonding step).

Next, the lead frame 30 is placed in the die for sealing and, as shown in FIG. 7, the lead frame 30 and the semiconductor chips 2 are sealed by the sealing resin 34 such that the lower surfaces 15 of the die pads 3, the lower surfaces 35 of the leads 32, and the lower surface of the supporting portion 31 are exposed (resin sealing step).

When the resin sealing step is completed, the semi-finished product 40 is completed. The semi-finished product 40 includes the lead frame 30, the semiconductor chips 2, and the sealing resin 34 sealing these. The sealing resin 34 constitutes a plate shape covering the lead frame 30. The sealing resin 34 includes the lower surface 37 constituting the bottom surface thereof and the upper surface 38 constituting the top surface thereof. The lower surfaces 15 of the die pads 3, the lower surfaces 35 of the leads 32, and the lower surface of the supporting portion 31 are exposed from the lower surface 37 of the sealing resin 34. The lower surfaces 15 of the die pads 3 and the lower surfaces 35 of the leads 32 are flush with the lower surface of the sealing resin 34. Thereafter, a step of cutting the semi-finished product 40 to cut out the semiconductor devices 1 individually is performed.

First, as shown in FIG. 8, the first dicing blades 61 are moved along the dicing lines (unillustrated) set on the supporting portion 31 of the lead frame 30. Each first dicing blade 61 moves along the corresponding dicing line while rotating around the central axis of its disc shape. In this process, the first dicing blade 61 is inserted from the lower surface side of the supporting portion 31 (the lower surface 37 side of the sealing resin 34). The supporting portion 31, the sealing resin 34 on the supporting portion 31, the base end portions of the leads 32 that are present in regions of a predetermined width at both sides of the supporting portion 31, and the sealing resin 34 on the base end portions of the leads 32 are thereby removed (first dicing step).

As a result of the first dicing step, first groove portions 63 of substantially the same width as the first dicing blades 61 are formed at the courses through which the first dicing blades 61, passed as shown in FIG. 9. Each first groove portion 63 is a groove that is recessed from the lower surface 37 toward the upper surface 38 side of the sealing resin 34. The cross-sectional shape of the cutting edge of each first dicing blade 61 is a semicircle that bulges to the outer side and therefore the bottom surface of the first groove portion 63 is formed to the groove shape having the arcuate cross section that bulges toward the upper surface 38 of the sealing resin 34.

The bottom of each first groove portion 63 is at the intermediate position in the up-down direction (thickness direction) of the sealing resin 34 and the first groove portion 63 does not penetrate through the sealing resin 34. However, the first groove portion 63 penetrates through the supporting portion 31 and the base end portions of the leads 32. The depth D of the first groove portion 63 is greater than the thickness S of each lead 32.

By the first groove portions 63 being formed in the first dicing step, the respective leads 32 are cut off from the supporting portion 31 and become the leads 4. The outer end surface of each lead 4 is in the state of being flush with the side wall of the corresponding first groove portion 63 and is exposed from the wall surface thereof. In the process of forming the first groove portions 63, the side surfaces of the first dicing blades 61 contact the leads 32. The leads 32 are thus extended partially by being drawn out by the side surfaces of the first dicing blades 61 and therefore burrs form at the end portions of the leads 32. For example, as shown in FIG. 9, the downwardly projecting burrs 41 form at the lower edges of the outer end surfaces of the respective leads 4. Also as shown in FIG. 10, the burr 42 that is elongated in the lateral direction is formed at one-side portion of the outer end surface of each lead 4. The burr 42 is formed thinly above the side surface of the corresponding first groove portion 63. In the present preferred embodiment, the lead frame 30 is manufactured by etching a thin plate of metal. Therefore, although the transverse sectional shape (end surface shape) of each lead 4 is supposed to be a rectangular shape, it constitutes a shape that increases in width toward a thickness center portion. The metal chips and the resin chips that are generated during the first dicing step are washed off by flowing water from the water supply nozzle (unillustrated) during the first dicing step.

Whereas in the first manufacturing method described above, the exposed surfaces of the respective leads 32 and the exposed surfaces of the die pads 3 are etched after the first dicing step, the etching step is not present in the second manufacturing method.

In the second manufacturing method, when the first dicing step is completed, the plating step is performed without the etching step being performed. The second manufacturing method differs from the first manufacturing method in only this point. That is, when the first dicing step is completed, the plating layers 43, arranged to improve solder wettability, are formed on the lower surfaces 15 of the die pads 3 and the lower surfaces 18 and the outer end surfaces 20 of the leads 4, as shown in FIG. 19 (plating step). With the second manufacturing method, due to the etching step not being present, the plating step is performed in a state where the lower surfaces 15 of the die pads 3 and the lower surfaces 18 of the leads 4 are flush with the lower surface of the sealing resin 34, the outer end surfaces 20 of the leads 4 are flush with the side surfaces of the grooves 63, and the burrs 41 and 42 are formed on the leads 4.

The plating layers 43 have laminated structures of Ni (P) plating layers, formed by the electroless plating method on the lower surfaces 15 of the die pads 3 and the lower surfaces 18 and the outer end surfaces 20 of the leads 4, and Pd (Au) plating layers, formed on the Ni (P) plating layers by the electroless plating method. The forming of the plating layers 43 may be performed by the electroplating method.

Next, as shown in FIG. 20, the second dicing blades 62 are moved along the dicing lines (unillustrated) along which the first dicing blades 61 passed in the first dicing step. Each second dicing blade 62 moves, while rotating around the central axis of its disc shape, along the dicing line along which the first dicing blade 61 passed in the first dicing step. In this process, the second dicing blade 62 is inserted into the corresponding first groove portion 63.

The second dicing blades 62 pass through the width-direction central portions of the bottoms of the first groove portions 63 without contacting the side walls of the first groove portions 63. In this process, the second dicing blades 62 cut the sealing resin 34 present at positions deeper than the bottoms of the first groove portions 63. A cutting teeth portion of each second dicing blade 62 penetrates through the sealing resin 34. The sealing resin 34 present at the positions deeper than the bottoms of the first groove portions 63 is thereby removed (second dicing step). As a result of the second dicing step, second groove portions 64 of substantially the same width as the second dicing blades 62 are formed at the courses (the central portions of the bottoms of the first groove portions 63) through which the second dicing blades 62, passed as shown in FIG. 21. The groove width of the second groove portions 64 is narrower than the groove width of the first groove portions 63. The first groove portions 63 and the second groove portions 64 integrally constitute stepped grooves. The resin chips generated during the second dicing step are washed off by flowing water from the water supply nozzle (unillustrated) during the second dicing step.

By the second groove portions 64 being formed, the sealing resin 34 is cut apart at both sides of each first groove portion 63 and second groove portion 64 to become the sealing resins 5. Individual pieces of the semiconductor devices 1A are thereby obtained. In each semiconductor device 1A, the plating layer 43 on the lower surface 15 of the die pad 3 (see FIG. 20) becomes the die pad plating layer 17, and the plating layers 43 on the lower surfaces 35 of the leads 32 (see FIG. 20) become the lead plating layers 21. The wall surfaces (excluding the bottom surfaces with the arcuate cross sections) of the side walls of the first groove portions 63 become the first side surface portions 11 of the side surfaces 9 in the semiconductor device 1A. The wall surfaces of the side walls of the second groove portions 64 become the second side surface portions 12 of the side surfaces 9 in the semiconductor device 1A. The bottom surfaces having the arcuate cross sections of the first groove portions 63 become the connecting portions 13 of the side surfaces 9 in the semiconductor device 1A.

FIG. 22 is an illustrative sectional view of a mounting state of the semiconductor device 1A shown in FIG. 17.

The semiconductor device 1A that has been obtained as described above is surface-mounted with the lower surfaces 18 of the leads 4 facing the front surface 72, that is, the surface of the mounting substrate (wiring substrate) 71 at which the lands 73 are formed.

The cream solder 74 is coated on each land 73. In surface-mounting the semiconductor device 1 onto the mounting substrate 71, the lower surfaces 18 of the leads 4 are bonded to the lands 73 via the cream solder 74 and the lead plating layers 21.

The lead plating layers 21, arranged to improve solder wettability, are formed on the lower surfaces 18 of the leads 4 and the outer end surfaces 20 of the leads 4, and therefore, when the lower surfaces 18 of the leads 4 become bonded to the cream solder 74 on the land 73 in the above process, the cream solder 74 creepingly adheres closely to the outer end surfaces 20 of the leads 4. Consequently, the mounting strength of the semiconductor device 1A and the mounting substrate 71 can be improved and reliability of connection can be improved.

Also, by the above, so-called solder fillets are formed on the outer end surfaces 20 of the leads 4 and therefore appearance inspection of the state of bonding (soldering) of the leads 4 and the lands 73 can be performed readily.

Also, with the preferred embodiment described above, by the first dicing step, the respective leads 32 are cut off from the supporting portion 31 to become the leads 4 and the outer end surfaces 20 of the respective leads 4 become exposed from the wall surfaces of the first groove portions 63. In this state, although the first groove portions 63 are formed from the lower surface 37 side in the sealing resin 34 of the semi-finished product 40, the semi-finished product 40 is not separated completely. The outer end surfaces 20 of the respective leads 4 are thus exposed in the state where the semi-product 40 is not completely separated into the individual semiconductor devices and therefore the forming of the plating layers 43 (lead plating layers 21) on the outer end surfaces 20 of the respective leads 4 is made easy. Also, the forming of the plating layers 43 (lead plating layers 21) on the lower surfaces 18 of the respective leads 4, the forming of the plating layers 43 (die pad plating layers 17) on the lower surfaces 15 of the die pads 3, and the forming of the plating layers 43 (lead plating layers 21) on the outer end surfaces 20 of the respective leads 4 can be performed at the same time.

As mentioned above, the burrs 41 and 42 form at the end portions of the leads 4 due to the first dicing step. When such a burr is formed, the burr contacts a land 73 on the mounting substrate 71 during the mounting of the semiconductor device 1 onto the mounting substrate 71 shown in FIG. 22 and the semiconductor device 1 becomes lifted up from the mounting substrate 71 at the portion of the burr. When reflow is performed in this state, a mounting failure, such as a connection failure between a lead 4 and the land 73, etc., may occur due to thermal warpage of the mounting substrate 71.

However, with the second manufacturing method described above, although the etching step after the first dicing step is not present, the plating layers 43 are formed on the exposed surfaces of the leads 4 after the first dicing step and therefore a large portion of the burrs 41 and 42 are covered by the plating layers 43 of satisfactory solder wettability. Occurrence of amounting failure of a lead 4 and land 73 due to a burr can thus be prevented.

Although the preferred embodiments according to the present invention have been described above, the present invention may be implemented in yet other modes.

For example, although with the preferred embodiments described above, the die pad plating layer 17 is formed on the lower surface 15 of the die pad 3, an arrangement where the layer is not formed is also possible.

Also, although semiconductor devices applying a QFN were taken up, the present invention can also be applied to semiconductor devices applying an SON (Small Outlined Non-leaded Package) or other type of non-leaded package.

The present application corresponds to Japanese Patent Application No. 2016-54246 filed in the Japan Patent Office on Mar. 17, 2016, and the entire disclosure of this application is incorporated herein by reference.

While preferred embodiments of the present invention have been described above, it is to be understood that variations and modifications will be apparent to those skilled in the art without departing the scope and sprit of the present invention. The scope of the present invention, therefore, is to be determined solely by the following claims.

What is claimed is:

1. A semiconductor device comprising:
a semiconductor chip;
a plurality of leads, disposed in a periphery of the semiconductor chip; and
a sealing resin, sealing the semiconductor chip and the leads such that lower surfaces and outer end surfaces of the leads, at sides opposite the semiconductor chip, are exposed;
wherein
lead plating layers arranged to improve solder wettability are formed on the lower surfaces and the outer end surfaces of the leads, and
front surfaces of the lower surfaces of the plurality of leads excluding the lead plating layers are at higher height positions than a lower surface of the sealing resin.

2. The semiconductor device according to claim 1, wherein the plurality of leads are constituted of a metal that contains copper.

3. The semiconductor device according to claim 1, wherein a material constituting the lead plating layers contains Pd.

4. The semiconductor device according to claim 1, wherein burrs are not formed on the outer end surfaces of the leads.

5. The semiconductor device according to claim 1, wherein an end surface shape of the outer end surface of each of the leads excluding the lead plating layer is substantially the same as a cross-sectional shape of the lead disposed inside the sealing resin.

6. The semiconductor device according to claim 1, wherein the plurality of leads are disposed so as to be aligned at intervals at each of sides sandwiching the semiconductor chip.

7. The semiconductor device according to claim 1, further comprising:
a die pad, which has an upper surface and a lower surface, the semiconductor chip being die bonded to the upper surface of the die pad, and which is sealed by the sealing resin such that the lower surface of the die pad is exposed at the lower surface of the sealing resin; and
a die pad plating layer, arranged to improve solder wettability and formed on the lower surface of the die pad.

8. The semiconductor device according to claim 1, wherein the semiconductor device is a semiconductor device applying a QFN (Quad Flat Non-leaded Package).

9. The semiconductor device according to claim 1, wherein the semiconductor device is a semiconductor device applying an SON (Small Outlined Non-leaded Package).

10. The semiconductor device according to claim 1, wherein
the lower surfaces of the leads are exposed at the lower surface of the sealing resin, and the sealing resin further has an upper surface, at a side opposite the lower surface, and a side surface, which is continuous to the upper surface and the lower surface and at which the outer end surfaces of the leads are exposed,
the side surface of the sealing resin includes a first side surface portion, disposed near the lower surface of the sealing resin, and a second side surface portion, disposed near the upper surface of the sealing resin,
a step is formed between the first side surface portion and the second side surface portion such that the second side surface portion protrudes further outward than the first side surface portion, and
in regard to an up-down direction position of the sealing resin, the step is positioned between upper surfaces of the leads and the upper surface of the sealing resin.

11. The semiconductor device according to claim 10, wherein an amount of protrusion of the second side surface portion with respect to the first side surface portion is not more than 50 μm.

12. The semiconductor device according to claim 7, wherein the die pad is constituted of a metal that contains copper.

13. The semiconductor device according to claim 7, wherein a material constituting the die pad plating layer contains Pd.

14. The semiconductor device according to claim 7, wherein a front surface of the lower surface of the die pad excluding the die pad plating layer is at a higher height position than the lower surface of the sealing resin.

* * * * *